United States Patent
Asai et al.

(10) Patent No.: US 8,389,204 B2
(45) Date of Patent: Mar. 5, 2013

(54) METHOD FOR PRODUCING COMB-SHAPED ELECTRODE

(75) Inventors: Takahiro Asai, Kawasaki (JP); Koichi Misumi, Kawasaki (JP); Takashi Ono, Kawasaki (JP); Kiyoshi Kanamura, Hachioji (JP); Hirokazu Munakata, Hachioji (JP)

(73) Assignees: Tokyo Ohka Kogyo Co., Ltd., Kawasaki-shi (JP); Tokyo Metropolitan University, Tokyo (JP)

( * ) Notice: Subject to any disclaimer, the term of this patent is extended or adjusted under 35 U.S.C. 154(b) by 0 days.

(21) Appl. No.: 13/085,336

(22) Filed: Apr. 12, 2011

(65) Prior Publication Data
US 2011/0256484 A1    Oct. 20, 2011

(30) Foreign Application Priority Data

Apr. 14, 2010 (JP) ................ 2010-092864
Feb. 14, 2011 (JP) ................ 2011-028228

(51) Int. Cl.
*G03F 7/26* (2006.01)
(52) U.S. Cl. ............................................. 430/315
(58) Field of Classification Search ............ 430/319, 430/313, 315
See application file for complete search history.

(56) References Cited

U.S. PATENT DOCUMENTS
2006/0020051 A1 * 1/2006 Ito et al. .................. 522/31

FOREIGN PATENT DOCUMENTS
| JP | 58-211120 | * 8/1983 |
| JP | S60-41772 | 2/1994 |
| JP | H08-74033 | 3/1996 |
| JP | H08-124570 | 5/1996 |

* cited by examiner

*Primary Examiner* — Kathleen Duda
*Assistant Examiner* — Caleen Sullivan
(74) *Attorney, Agent, or Firm* — Knobbe Martens Olson & Bear LLP

(57) ABSTRACT

To provide a method for producing a comb-shaped electrode capable of precisely carrying a large amount of active materials on a surface of current collectors with a fine shape. The method for producing comb-shaped electrodes 1a, 1b of the present invention includes a current collector forming step of forming a pair of comb-shaped current collectors 2a, 2b on a surface of a substrate 4, a resist coating step of forming a resist layer 6 on the surface of the substrate 4, and a guide hole forming step of forming guide holes 7a, 7b for forming a positive electrode 1a or a negative electrode 1b, in which a cationic polymerization type resist composition (i), a novolak type resist composition (ii), a chemically-amplified type resist composition (iii), or a radical polymerization type resist composition (iv), is used as a resist composition for forming the resist layer 6.

3 Claims, 5 Drawing Sheets

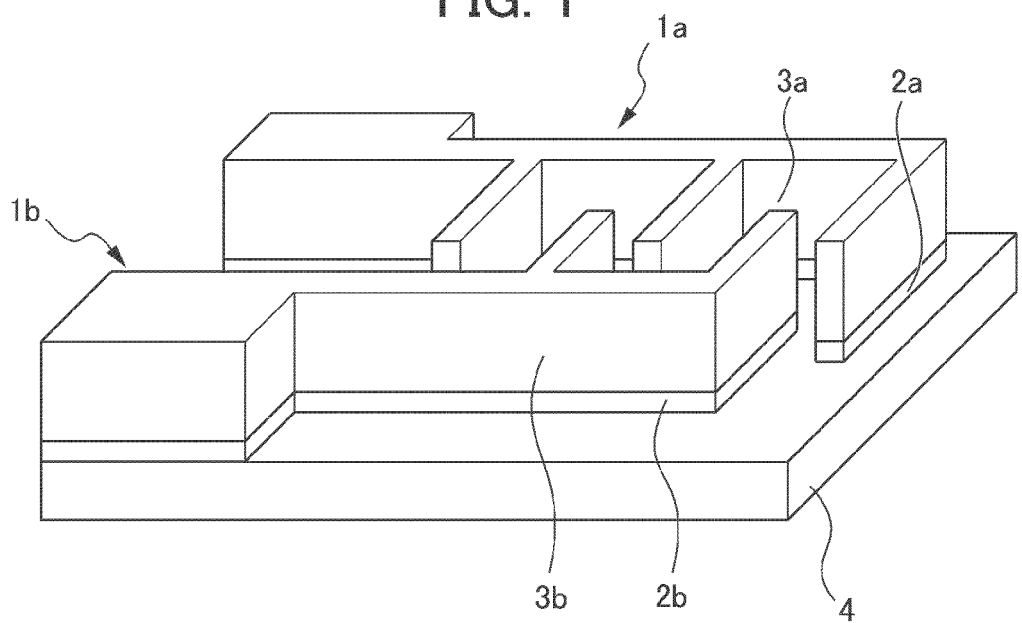

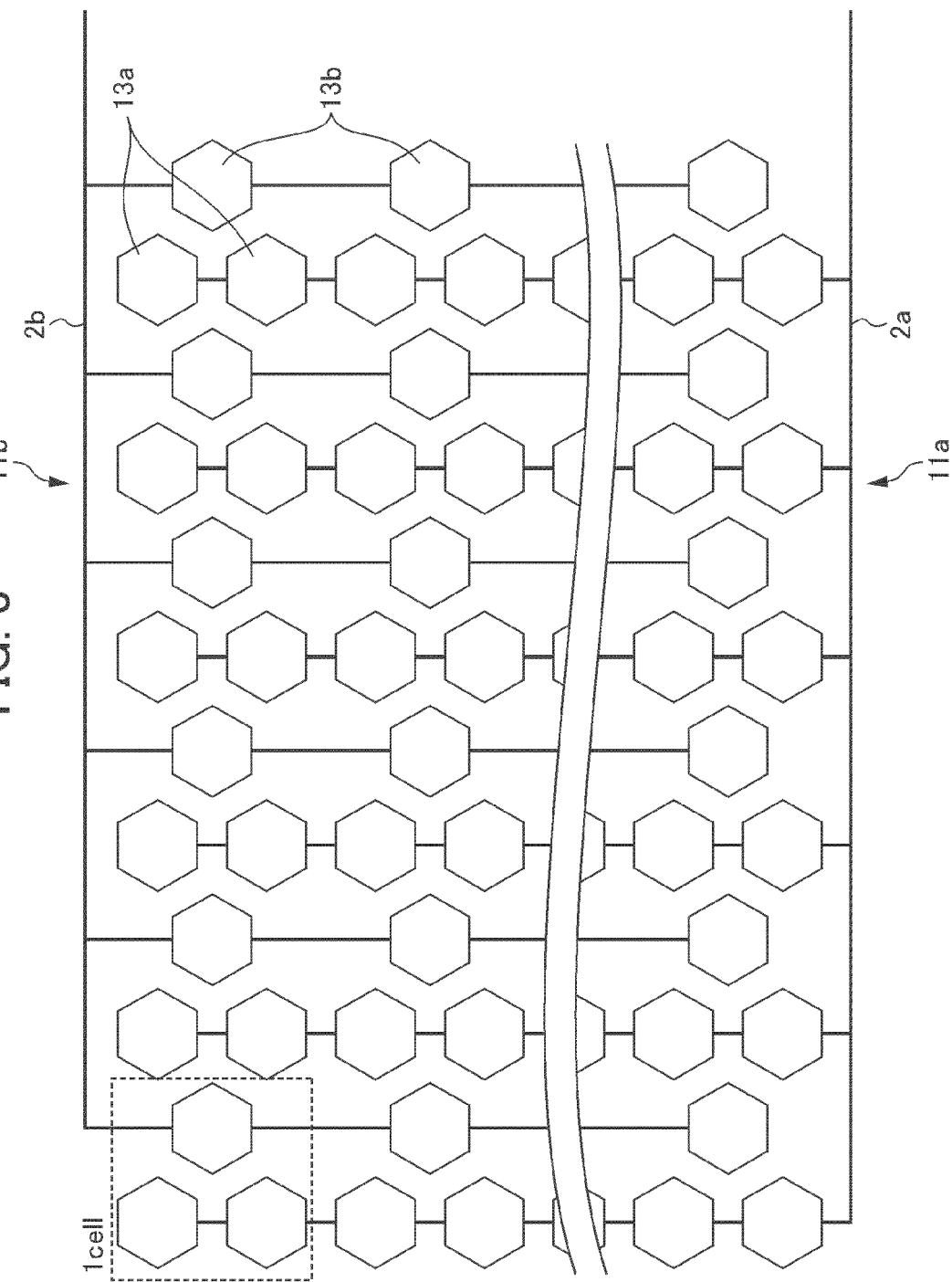

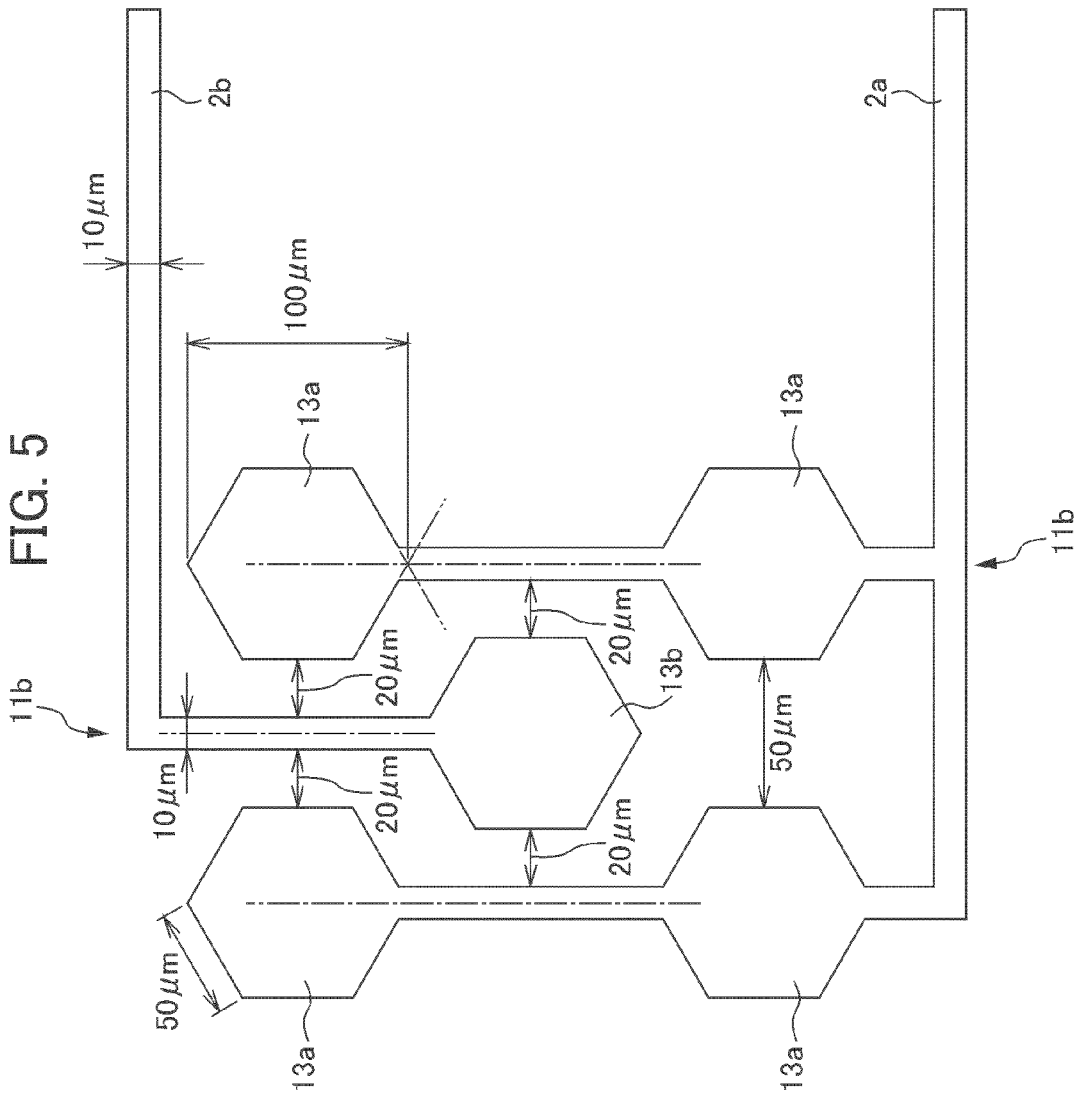

METHOD FOR PRODUCING COMB-SHAPED ELECTRODE

This application is based on and claims the benefit of priority from Japanese Patent Application Nos. 2010-092864 and 2011-028228, respectively filed on 14 Apr. 2010 and 14 Feb. 2011, the contents of which are incorporated herein by reference.

BACKGROUND OF THE INVENTION

1. Field of the Invention

The present invention relates to a method for producing a comb-shaped electrode, more specifically, to a method for producing a comb-shaped electrode in which a positive electrode and a negative electrode are respectively formed into a comb shape and oppositely disposed so that the parts of teeth of the comb shapes are alternatively arranged.

2. Related Art

Secondary cells capable of being repeatedly charged and discharged have been widely used for various applications starting with portable devices such as cell-phones and laptop personal computers. Furthermore, in recent years, these cells have been used for environment-related fields such as electric powered vehicles and hybrid vehicles.

The secondary cells are constructed by combining a positive electrode on which a positive-electrode active material is carried and a negative electrode on which a negative-electrode active material is carried. Typical secondary cells are constructed by oppositely combining a positive electrode and a negative electrode of thin film with a large area through a separator and wrapping them (e.g., see Patent Document 1). By virtue of this construction of the secondary cells, the area of positive and negative electrodes can be increased, and capacity and available current of the secondary cells can be increased. However, these secondary cells are likely to be larger, thus the application will be for larger devices such as notebook-size personal computers, for example.

A polymer-type lithium ion secondary cell is publicly known as a secondary cell for small devices such as cell-phones (e.g., see Patent Document 2). This is a secondary cell in which a conductive polymer is used and has a large degree of freedom with respect to shape, therefore can be of a desired size or shape depending on the size or shape of devices.

On the other hand, in regards to the technology to form a patterned conductive material in the fields of liquid crystal displays and semiconductor devices, for example, a method of forming a conductive layer of thin film of a conductive material and patterning the conductive layer by a process such as photolithography to process into a conductive material with a desired shape is publicly known (e.g., see Patent Document 3). In accordance with this method, a fine conductive material to drive a liquid crystal display can be precisely formed, for example.

[Patent Document 1] Japanese Unexamined Patent Application, Publication No. S60-41772

[Patent Document 2] Japanese Unexamined Patent Application, Publication No. H08-124570

[Patent Document 3] Japanese Unexamined Patent Application, Publication No. H08-74033

SUMMARY OF THE INVENTION

Incidentally, in recent years, micro devices that are smaller than the small devices described above have been developed, and secondary cells of micro order are required as a power source of the micro devices. It is required for the secondary cell that the cell can be effectively activated within a limited space inside the micro devices, thus design of the cell is important. As for the design of the cell, a configuration may be envisaged in which a positive electrode and a negative electrode are formed into a fine comb shape by lithography and these electrodes are disposed so that the parts of teeth of the comb shapes face oppositely. In the case of the cell with this configuration, it may be expected that the output current can be increased since the area where the positive and the negative electrodes contact through a minute space of separator can be increased by approximating the positive and the negative electrodes through a minute space.

On the other hand, cell capacity is proportional to an amount of positive-electrode and negative-electrode active materials respectively carried on the positive and negative electrodes. It is therefore a problem from the viewpoint of increasing the cell capacity how to carry the positive-electrode and negative-electrode active materials as much as possible on the surface of a current collector on which the positive and negative electrodes are formed. However, currently, there is not yet a method which can precisely carry a large amount of active materials on the surface of the current collector with a complex and fine shape of micro order like the comb shape described above.

The present invention has been made in view of the problems described above; and it is an object of the present invention to provide a method for producing a comb-shaped electrode that can precisely carry a large amount of active materials on the surface of the current collector with a fine shape.

The present inventors have found that the problems described above can be solved by employing a method in which comb-shaped current collectors are formed on a substrate, a resin pattern of a resist is formed on a surface of the substrate so that space above the current collectors becomes guide holes to deposit a positive-electrode or negative-electrode material, then an active material is deposited on a surface of the current collectors using the guide holes as casting molds thereof by a process such as a plating process, a electrophoresis process, etc., thereby completing the present invention.

The present invention is a method for producing a comb-shaped electrode, in which a positive electrode and a negative electrode are respectively formed into a comb shape and oppositely disposed so that the parts of teeth of the comb shapes are alternatively arranged; and the method includes a current collector forming step of forming a conductive layer on a surface of a substrate and patterning the conductive layer into at least a pair of comb shapes to form a current collector, a resist coating step of coating a resist composition on the surface of the substrate containing the part of the current collector formed in the current collector forming step to form a resist layer, and a guide hole forming step of forming a guide hole for forming the positive electrode or the negative electrode above the current collector by irradiating the surface of the resist layer with light through a mask and developing to remove the part of the resist layer positioned above the current collector, in which the resist composition is one of the resist compositions (i) to (iv) below:

(i) a cationic polymerization type resist composition containing a compound with an epoxy group and a cationic polymerization initiator, (ii) a novolak type resist composition containing a novolak resin and a photosensitizing agent, (iii) a chemically-amplified type resist composition containing a resin which has an acid-dissociating elimination group and increases alkali solubility when the elimination group is eliminated by action of an acid generated from a photo-acid-generating agent through exposure and the photo-acid-generating agent, and (iv) a radical polymerization type resist composition containing a monomer having an ethylenically unsaturated bond and/or a resin having an ethylenically unsaturated bond, and a radical polymerization initiator in which the number of the ethylenically unsaturated bond per molecule of the monomer is 3 or less when containing the monomer having the ethylenically unsaturated bond.

In accordance with the present invention, a method for producing a comb-shaped electrode capable of precisely carrying a large amount of active materials on a surface of current collectors with a fine shape can be provided.

BRIEF DESCRIPTION OF THE DRAWINGS

FIG. 1 is a perspective view schematically showing a comb-shaped electrode which is produced in accordance with a first embodiment of the method for producing a comb-shaped electrode of the present invention;

FIG. 3 is a plan view schematically showing a comb-shaped electrode (positive-electrode active material 13a: negative-electrode active material 13b=2:1) which is produced in accordance with a second embodiment of the method for producing a comb-shaped electrode of the present invention;

FIG. 5 is a plan view schematically showing a comb-shaped electrode which is produced in accordance with the second embodiment of the method for producing a comb-shaped electrode of the present invention.

DETAILED DESCRIPTION OF THE INVENTION

Figure 2A:
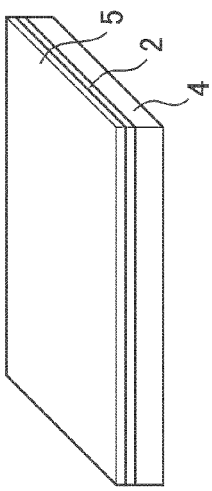
FIG. 2 is perspective views showing by way of FIGS. 2A to 2I the steps in the first embodiment of the method for producing a comb-shaped electrode of the present invention.

The first embodiment of the method for producing a comb-shaped electrode of the present invention is explained below with reference to figures. FIG. 1 is a perspective view schematically showing a comb-shaped electrode which is produced in accordance with the first embodiment of the method for producing a comb-shaped electrode of the present invention. FIG. 2 is perspective views showing the steps by FIGS. 2A to 2I in the first embodiment of the method for producing a comb-shaped electrode of the present invention. In addition, as to FIG. 2H, a current collector 2a at bottom of a guide hole 7a is omitted considering viewability thereof.

Initially, one example of comb-shaped electrodes 1a, 1b produced in accordance with the first embodiment of the method for producing a comb-shaped electrode of the present invention is explained with reference to FIG. 1. The comb-shaped electrodes 1a, 1b are respectively formed into a comb shape and oppositely disposed so that the parts of teeth of the comb shapes are alternatively arranged. Here, the comb-shaped electrode 1a is a positive electrode and the comb-shaped electrode 1b is a negative electrode. This construction of the comb-shaped electrodes 1a, 1b leads to a short distance between the electrodes, a constant resistance of electrolyte, and effective exchange of lithium ion, which enables an increase in electric capacity.

A separator (not shown) for separating the comb-shaped electrodes 1a and 1b is provided between the both to electrically separate the both. The comb-shaped electrodes 1a, 1b are formed on a surface of a substrate 4 having a nonconductive surface. The substrate 4 is exemplified by a silicon substrate having an oxide film at the surface.

The comb-shaped electrode 1a of a positive electrode has a current collector 2a to allow the flow of current and a positive-electrode active material layer 3a formed on the surface of the current collector 2a. The current collector 2a is formed into a comb shape in planar view. Then, the positive-electrode active material layer 3a is formed on the surface of the comb-shaped current collector 2a and formed into a comb shape in planar view similarly as the current collector 2a.

The current collector 2a is constructed from a metal preferably gold in order to impart conductivity. Then, in order to ensure adhesion between the current collector 2a and the substrate 4, an adhesion imparting layer (not shown) is formed between the current collector 2a and the substrate 4 as required. The adhesion imparting layer is appropriately set considering the material of the current collector 2a and the material of the substrate 4. For example, when the current collector 2a is constructed from gold and the substrate 4 is constructed from silicon, a thin film of titanium is preferably used as the adhesion imparting layer. The thickness of the current collector 2a and the thickness of the adhesion imparting layer may be optionally decided without being particularly limited. For example, the thickness of the current collector 2a is 100 nm and the thickness of the adhesion imparting layer is 50 nm, without particular limitation thereto.

The comb-shaped electrode 1b of a negative electrode has a current collector 2b to allow the flow of current and a negative-electrode active material layer 3b formed on the surface of the current collector 2b. The other items of the comb-shaped electrode 1b are similar to those of the comb-shaped electrode 1a of a positive electrode; therefore, explanations thereof are omitted.

An electrolyte (not shown) is provided between the comb-shaped electrode 1a of a positive electrode and the comb-shaped electrode 1b of a negative electrode. Thereby, the comb-shaped electrodes 1a, 1b respectively generate an electrode reaction, and current can flow from the current collectors 2a, 2b.

The material to construct the positive-electrode active material layer 3a and the negative-electrode active material layer 3b and the species of the electrolyte may be appropriately set depending on the species of cell to be formed. In regards to a lithium ion secondary cell, for example, the material to construct the positive-electrode active material layer 3a may be exemplified by transition metal oxides such as Lithium cobalt oxide, etc., the material to construct the negative-electrode active material layer 3b may be exemplified by carbon, graphite, lithium titanate, etc., and the material to construct the electrolyte may be exemplified by an organic solvent such as diethyl carbonate dissolving a salt such as hexafluoro lithium phosphate, etc.

Next, the method for producing a comb-shaped electrode in this embodiment is explained. The method for producing a comb-shaped electrode in this embodiment includes at least a current collector forming step, a resist coating step, and a guide hole forming step, and further an active material layer forming step. These steps are explained with reference to FIG. 2 below.

Current Collector Forming Step

The current collector forming step is sequentially shown by FIG. 2A to FIG. 2F.

Figure 2B:
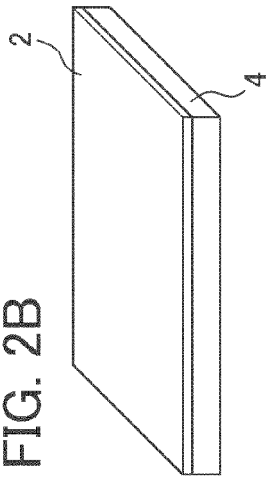

In this step, a conductive layer 2 of thin film is formed on the surface of the substrate 4 (FIG. 2A to FIG. 2B). The substrate 4 is a non-conductive material, or a conductive material or a semiconductor forming a layer of non-conductive material at least on the surface, and may be exemplified by a silicon substrate having an oxide film on the surface. The conductive layer 2 is a conductive material and preferably a thin film of a metal. In order to form the conductive layer 2 on the surface of the substrate 4, various conventional processes such as vapor deposition processes including PVD or CVD processes, sputtering processes, plating processes, and metal foil adhesive processes may be employed. The thickness of the conductive layer 2 may be appropriately set considering the performance required to the comb-shaped electrodes 1a, 1b.

For example, when the substrate 4 is a silicon substrate having an oxide film on the surface and the conductive layer 2 is formed of a thin film of gold, initially, a thin film of titanium (not shown) is formed on the surface of the substrate by a sputtering process and a thin film of gold as the conductive layer 2 is formed on the surface of the thin film of titanium by a sputtering process. In this case, the thin film of titanium is provided in order to improve adhesion of the conductive layer 2 with the silicon substrate 4. The thicknesses of the thin film of titanium and the conductive layer 2 may be respectively exemplified by 50 nm and 100 nm, which may be appropriately set considering necessary performance.

Figure 2C:
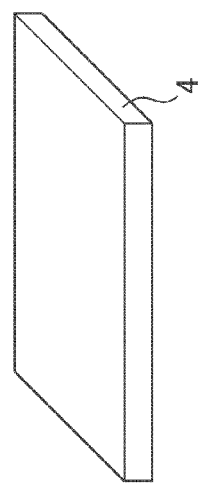

After forming the conductive layer 2, as shown by FIG. 2C, a current collector forming resist is coated on the surface of the conductive layer 2 to form a current collector forming resist layer 5. The current collector forming resist layer 5 is provided in order to form the comb-shaped current collectors 2a, 2b by patterning the conductive layer 2.

Conventional various resist compositions may be used for the current collector forming resist. In addition, the term "current collector forming resist" is used for distinguishing it from the resist used to form the guide holes 7a, 7b described later. The current collector forming resist may be the same as or different from the resist used in the guide hole forming step described later.

The process to coat the current collector forming resist may be exemplified by conventional processes without particular limitation. The process may be exemplified by spin coating processes, dipping processes, brush coating processes, etc.

Figure 2D:
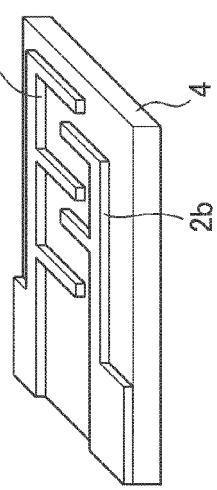
Figure 2E:
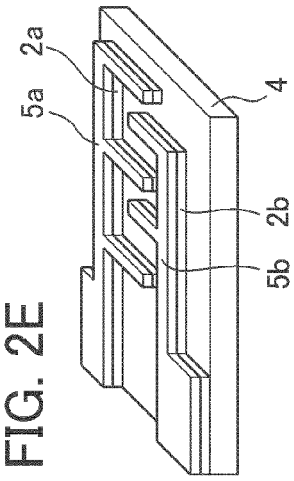

The resulting current collector forming resist layer 5 is selectively exposed through a comb-shaped mask pattern and developed to form current collector forming resin patterns 5a, 5b. Thereby, the current collector forming resin patterns 5a, 5b are formed on the surface of the conductive layer 2, as shown by FIG. 2D. The number of teeth, tooth thickness, gap between patterns (space gap), etc. in the comb-shaped resin patterns 5a, 5b may be appropriately set considering necessary performance. The number of teeth may be exemplified by 5 to 500 pairs, the tooth thickness may be exemplified by 1 to 50 µm, and the space gap may be exemplified by 1 to 50 µm. For example, the number of teeth is 100 pairs (the number of teeth is 100 in one side of the resin pattern), the tooth thickness is 20 µm, and the space gap is 10 to 20 µm, without particular limitation thereto.

Figure 2F:
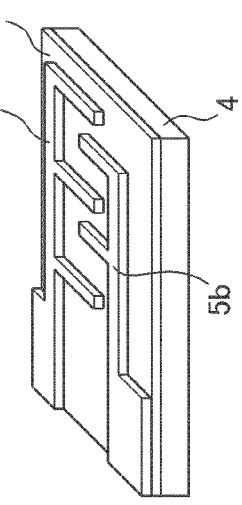

Then, the part of the conductive layer 2 not covered by the patterns 5a, 5b is removed. Conventional processes may be used to remove the conductive layer 2 without particular limitation. The process may be exemplified by etching processes, ion milling processes, etc. The comb-shaped current collectors 2a, 2b are formed by removing the part of the conductive layer 2 not covered by the patterns 5a, 5b. Then, the patterns 5a, 5b are removed, and the comb-shaped current collectors 2a, 2b are exposed on the surface of the substrate 4 as shown by FIG. 2F.

Resist Coating Step

Figure 2G:
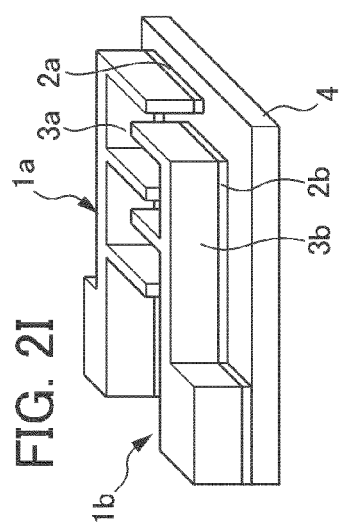
Figure 2H:
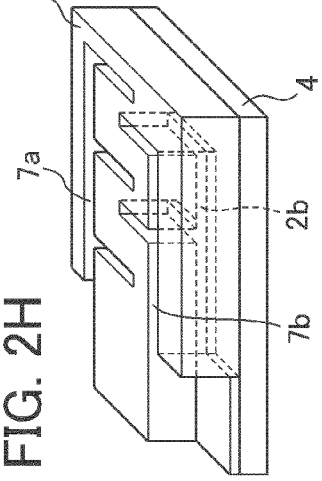

Next, the resist coating step is explained. The resist coating step is carried out after the current collector forming step and is shown by FIG. 2G.

In this step, a resist composition is coated to form a resist layer 6 on the surface of the substrate 4 containing the part of the current collectors 2a, 2b formed by the current collector forming step.

Conventional processes may be used for the process to form the resist layer 6 by coating the resist composition on the surface of the substrate, without particular limitation. In the resist layer 6, guide holes 7a, 7b are formed for forming a positive-electrode active material layer 3a and a negative-electrode active material layer 3b, as described later. The guide holes 7a, 7b are molds for forming the positive-electrode active material layer 3a and the negative-electrode active material layer 3b and thus are required to have a sufficient depth for forming the positive-electrode active material layer 3a and the negative-electrode active material layer 3b. The thickness of the resist layer 6 is approximately equal to the future depth of the guide holes 7a, 7b, and thus is appropriately set considering the necessary depth of the guide holes 7a, 7b. The thickness of the resist layer 6 is exemplified by 10 to 100 µm, without particular limitation thereto.

One of a cationic polymerization type resist composition containing a compound with an epoxy group and a cationic polymerization initiator (i), a novolak type resist composition containing a novolak resin and a photosensitizing agent (ii), a chemically-amplified type resist composition containing a resin which has an acid-dissociating elimination group and increases alkali solubility when the elimination group is eliminated by action of an acid generated from a photo-acid-generating agent through exposure and the photo-acid-generating agent (iii), and a radical polymerization type resist composition containing a monomer and/or a resin having an ethylenically unsaturated bond and a radical polymerization initiator in which the number of the ethylenically unsaturated bond per molecule of the monomer is 3 or less when containing the monomer having the ethylenically unsaturated bond (iv), is used as the resist composition for forming the resist layer. The resist compositions are explained below.

Initially, the cationic polymerization type resist composition (i) is explained. The cationic polymerization type resist composition contains at least a compound with an epoxy group and a cationic polymerization initiator, the cationic polymerization initiator generates a cation by being irradiated with an active energy beam such as UV rays, and the compound with an epoxy group polymerizes by the cation, resulting in higher molecular weight and curing.

The compound with an epoxy group is not particularly limited as long as it has an epoxy group in the molecule and is preferably a compound having two or more epoxy groups per molecule from the viewpoint of imparting solvent resistance and plating solution resistance to the pattern formed from the resist composition. The compound may be exemplified by multifunctional epoxy resins.

The multifunctional epoxy resin may be any epoxy resin as long as it has a sufficient number of epoxy groups per molecule for curing the resist layer 6 formed from the resist composition. Preferable examples of the multifunctional epoxy resin include phenol novolak type epoxy resins, ortho-cresol novolak type epoxy resins, triphenyl type novolak type epoxy resins, and bisphenol A novolak type epoxy resins.

The functionality of the multifunctional epoxy resin, which is the number of epoxy groups per molecule, is preferably 3 or more and more preferably 4 to 12. The functionality of the multifunctional epoxy resin of 3 or more is preferred since resin patterns with higher aspect ratio and resolution can be formed, and the functionality of the multifunctional epoxy resin of 12 or less is preferred since resin synthesis can be easily controlled and excessive increase of internal stress in resin patterns can be suppressed.

The mass average molecular mass of the multifunctional epoxy resin is preferably 700 to 5,000 and more preferably 1,000 to 4,000. A mass average molecular mass of the multifunctional epoxy resin of 700 or more is preferred since heat flow of curable resin composition prior to curing by irradiation with an active energy beam can be suppressed and a mass average molecular mass of the multifunctional epoxy resin of 5,000 or less is preferred since an appropriate dissolution velocity can be obtained during development.

Particularly preferable multifunctional epoxy resins are 8-functional bisphenol A novolak-type epoxy resin (manufactured by Japan Epoxy Resin Co., product name: jER157S70), an average of 6.4-functional bisphenol A novolak-type epoxy resin (manufactured by DIC Co., product name: EPICLON N-885), and an average of 5.6-functional bisphenol A novolak-type epoxy resin (manufactured by DIC Co., product name: EPICLON N-865).

The multifunctional bisphenol A novolak-type epoxy resin may be represented by General Formula (1) below, for example.

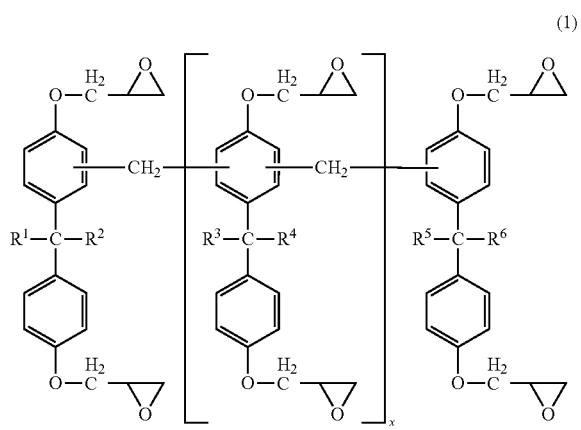

(1)

(In General Formula (1), $R^1$ to $R^6$ represent a hydrogen atom or a methyl group;

x is 0 or a positive integer, preferably an integer of 1 to 10, and more preferably an integer of 1 to 5; and the epoxy group in General Formula (1) may react and bond with other bisphenol A type epoxy resin or other bisphenol A novolak-type epoxy resin.)

The content of the multifunctional epoxy resin in the cationic polymerization type resist composition is preferably 70% to 95% by mass based on the solid content in the resist composition and more preferably 75% to 93% by mass. A concentration of 70% by mass or more of the multifunctional epoxy resin based on the solid content in the cationic polymerization type resist composition is preferred since the hardened material resulting from curing can be imparted with sufficient strength. Furthermore, the concentration of 95% by mass or less of the multifunctional epoxy resin based on the solid content in the cationic polymerization type resist composition is preferred since a sufficient sensitivity can be obtained when light-curing the cationic polymerization type resist composition. In this connection, "solid content" in this specification means the residual components after removing solvents from the composition.

Next, the cationic polymerization initiator is explained. The cationic polymerization initiator used in the present invention is a compound which generates a cation by being irradiated with active energy beam such as UV-rays, far-UV rays, excimer lasers of KrF, ArF, etc., X-rays and electron beam, and the cation can be a polymerization initiator.

The cationic polymerization initiator may be represented by General Formula (2) below, for example.

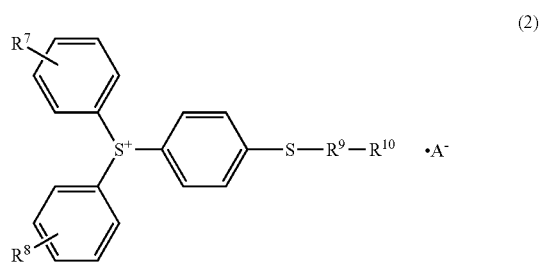

(2)

(In General Formula (2), $R^7$ and $R^8$ each independently represent a hydrogen atom, a halogen atom, a hydrocarbon group which may contain an oxygen atom or a hydrogen atom, or an alkoxy group to which a substituent may bond; $R^9$ represents a p-phenylene group of which one or more hydrogen atoms may be substituted by a halogen atom or an alkyl group; $R^{10}$ represents a hydrocarbon group which may contain a hydrogen atom, an oxygen atom or a halogen atom, a benzoyl group which may contain a substituent, or a polyphenyl group which may have a substituent; and $A^-$ represents a counter ion of an onium ion.)

In General Formula (2), specifically, $A^-$ is exemplified by $SbF_6^-$, $PF_6^-$, $AsF_6^-$, $BF_4^-$, $SbCl_6^-$, $ClO_4^-$, $CF_3SO_3^-$, $CH_3SO_3^-$, $FSO_3^-$, $F_2PO_2^-$, p-toluene sulfonate, nonafluorobutane sulfonate, adamantane carboxylate, tetraarylborate, fluorinated alkyl fluorophosphoric acid anion represented by General Formula (3) below, etc.

$[(Rf)_b PF_{6-b}]^-$ (3)

(In General Formula (3), Rf represents an alkyl group of which 80% or more hydrogen atoms are each substituted by a fluorine atom;

b represents a number and is an integer of 1 to 5; and

Rf in the number of b may be identical or different to each other.)

Examples of the cationic initiator include 4-(2-chloro-4-benzoyl phenylthio)phenyldiphenyl sulfonium hexafluoroantimonate, 4-(2-chloro-4-benzoyl phenylthio)phenylbis(4-fluorophenyl)sulfonium hexafluoroantimonate, 4-(2-chloro-4-benzoyl phenylthio)phenylbis(4-chlorophenyl)sulfonium hexafluoroantimonate, 4-(2-chloro-4-benzoyl phenylthio)phenylbis(4-methylphenyl)sulfonium hexafluoroantimonate, 4-(2-chloro-4-benzoyl phenylthio)phenylbis(4-(β-hydroxyethoxy)phenyl)sulfonium hexafluoroantimonate, 4-(2-methyl-4-benzoyl phenylthio)phenylbis(4-fluorophenyl)sulfonium hexafluoroantimonate, 4-(3-methyl-4-benzoyl phenylthio)phenylbis(4-fluorophenyl)sulfonium hexafluoroantimonate, 4-(2-fluoro-4-benzoyl phenylthio)phenylbis(4-fluorophenyl)sulfonium hexafluoroantimonate, 4-(2-methyl-4-benzoyl phenylthio)phenylbis(4-fluorophenyl)sulfonium hexafluoroantimonate, 4-(2,3,5,6-tetramethyl-4-benzoyl phenylthio)phenylbis(4-fluorophenyl)sulfonium hexafluoroantimonate, 4-(2,6-dichloro-4-benzoyl phenylthio)phenylbis(4-fluorophenyl)sulfonium hexafluoroantimonate, 4-(2,6-dimethyl-4-benzoyl phenylthio)phenylbis(4-fluorophenyl)sulfonium hexafluoroantimonate, 4-(2,3-dimethyl-4-benzoyl phenylthio)phenylbis(4-fluorophenyl)sulfonium hexafluoroantimonate, 4-(2-methyl-4-benzoyl phenylthio)phenylbis(4-chlorophenyl)sulfonium hexafluoroantimonate, 4-(3-methyl-4-benzoyl phenylthio)phenylbis(4-chlorophenyl)sulfonium hexafluoroantimonate, 4-(2-fluoro-4-benzoyl phenylthio)phenylbis(4-chlorophenyl)sulfonium hexafluoroantimonate, 4-(2-methyl-4-benzoyl phenylthio)phenylbis(4-chlorophenyl)sulfonium hexafluoroantimonate, 4-(2,3,5,6-tetramethyl-4-benzoyl phenylthio)phenylbis(4-chlorophenyl)sulfonium hexafluoroantimonate, 4-(2,6-dichloro-4-benzoyl phenylthio)phenylbis(4-chlorophenyl)sulfonium hexafluoroantimonate, 4-(2,6-dimethyl-4-benzoyl phenylthio)phenylbis(4-chlorophenyl)sulfonium hexafluoroantimonate, 4-(2,3-dimethyl-4-benzoyl phenylthio)phenylbis(4-chlorophenyl)sulfonium hexafluoroantimonate, 4-(2-chloro-4-acetylphenylthio)phenyldiphenyl sulfonium hexafluoroantimonate, 4-(2-chloro-4-(4-methylbenzoyl)phenylthio)phenyldiphenyl sulfonium hexafluoroantimonate, 4-(2-chloro-4-(4-fluorobenzoyl)phenylthio)phenyldiphenyl sulfonium hexafluoroantimonate, 4-(2-chloro-4-(4-methoxybenzoyl)phenylthio)phenyldiphenyl sulfonium hexafluoroantimonate, 4-(2-chloro-4-dodecanoylphenylthio)phenyldiphenyl sulfonium hexafluoroantimonate, 4-(2-chloro-4-acetylphenylthio)phenylbis(4-fluorophenyl)sulfonium hexafluoroantimonate, 4-(2-chloro-4-(4-methylbenzoyl)phenylthio)phenylbis(4-fluorophenyl)sulfonium hexafluoroantimonate, 4-(2-chloro-4-(4-fluorobenzoyl)phenylthio)phenylbis(4-fluorophenyl)sulfonium hexafluoroantimonate, 4-(2-chloro-4-(4-methoxybenzoyl)phenylthio)phenylbis(4-fluorophenyl)sulfonium hexafluoroantimonate, 4-(2-chloro-4-dodecanoylphenylthio)phenylbis(4-fluorophenyl)sulfonium hexafluoroantimonate, 4-(2-chloro-4-acetylphenylthio)phenylbis(4-chlorophenyl)sulfonium hexafluoroantimonate, 4-(2-chloro-4-(4-methylbenzoyl)phenylthio)phenylbis(4-chlorophenyl)sulfonium hexafluoroantimonate, 4-(2-chloro-4-(4-fluorobenzoyl)phenylthio)phenylbis(4-chlorophenyl)sulfonium hexafluoroantimonate, 4-(2-chloro-4-(4-methoxybenzoyl)phenylthio)phenylbis(4-chlorophenyl)sulfonium hexafluoroantimonate, 4-(2-chloro-4-dodecanoylphenylthio)phenylbis(4-chlorophenyl)sulfonium hexafluoroantimonate, 4-(2-chloro-4-benzoyl phenylthio)phenyldiphenyl sulfonium hexafluorophosphate, 4-(2-chloro-4-benzoyl phenylthio) phenyldiphenylsulfonium tetrafluoroborate, 4-(2-chloro-4-benzoyl phenylthio)phenyldiphenyl sulfonium perchlorate, 4-(2-chloro-4-benzoyl phenylthio)phenyldiphenyl sulfonium trifluoromethanesulfonate, 4-(2-chloro-4-benzoyl phenylthio)phenylbis(4-fluorophenyl)sulfonium hexafluorophosphate, 4-(2-chloro-4-benzoyl phenylthio)phenylbis(4-fluorophenyl)sulfonium tetrafluoroborate, 4-(2-chloro-4-benzoyl phenylthio)phenylbis(4-fluorophenyl)sulfonium perchlorate, 4-(2-chloro-4-benzoyl phenylthio)phenylbis(4-fluorophenyl)sulfonium trifluoromethanesulfonate, 4-(2-chloro-4-benzoyl phenylthio)phenylbis(4-fluorophenyl)sulfonium p-toluenesulfonate, 4-(2-chloro-4-benzoyl phenylthio)phenylbis(4-fluorophenyl)sulfonium camphorsulfonate, 4-(2-chloro-4-benzoyl phenylthio)phenylbis(4-fluorophenyl)sulfonium nonafluorobutanesulfonate, 4-(2-chloro-4-benzoyl phenylthio)phenylbis(4-chlorophenyl)sulfonium hexafluorophosphate, 4-(2-chloro-4-benzoyl phenylthio)phenylbis(4-chlorophenyl)sulfonium tetrafluoroborate, 4-(2-chloro-4-benzoyl phenylthio)phenylbis(4-chlorophenyl)sulfonium perchlorate, 4-(2-chloro-4-benzoyl phenylthio)phenylbis(4-chlorophenyl)sulfonium trifluoromethanesulfonate, diphenyl[4-(phenylthio)phenyl]sulfonium trifluorotrispentafluoro ethylphosphate, diphenyl[4-(p-terphenylthio)phenyl]sulfonium hexafluoroantimonate, and diphenyl[4-(p-terphenylthio)phenyl]sulfonium trifluorotrispentafluoro ethylphosphate. Among these compounds, 4-(2-chloro-4-benzoyl phenylthio)phenylbis(4-fluorophenyl)sulfonium hexafluoroantimonate (manufactured by ADEKA Co., Adeka Optomer SP-172), diphenyl[4-(phenylthio)phenyl]sulfonium trifluorotrispentafluoro ethylphosphate (manufactured by San-Apro Ltd., CPI-210S), diphenyl [4-(p-terphenylthio)phenyl]sulfonium hexafluoroantimonate, and diphenyl[4-(p-terphenylthio)phenyl]sulfonium trifluorotrispentafluoro ethylphosphate (manufactured by San-Apro Ltd., HS-1PG) are preferable.

The content of the cationic polymerization initiator in the cationic polymerization type resist composition is preferably 0.1% to 10% by mass based on the solid content of the resist composition, and more preferably 0.5% to 5% by mass. A content of 0.1% by mass or more of the cationic polymerization initiator in the cationic polymerization type resist composition is preferred since curing time of the cationic polymerization type resist composition by exposure of active energy beam is appropriate. Furthermore, a content of 10% by mass or less of the cationic polymerization initiator in the cationic polymerization type resist composition is preferred since developing property after exposure by active energy beam is satisfactory.

Sensitizers, silane coupling agents, solvents, etc. can be added to the cationic polymerization type resist composition depending on a necessary property.

A naphthol type sensitizer is exemplified as the sensitizer. In a case that sensitivity of the cationic polymerization type resist composition is high and a gap exists between a photomask and the resist layer 6, development after exposure may result in the resulting resin pattern (hardened material) being thicker in size than the photomask; but this thickening phenomenon can be suppressed without lowering the sensitivity by including the naphthol type sensitizer. Thus the addition of the naphthol type sensitizer is preferred since size error of the resin pattern to the size of the photomask can be reduced.

Preferable examples of the naphthol type sensitizer are 1-naphthol, β-naphthol, α-naphthol methyl ether, and α-naphthol ethyl ether; and a more preferable example is 1-naphthol in view of the effect to suppress the thickening phenomenon without lowering the sensitivity.

The silane coupling agent is used in order to improve adhesion between the resin pattern formed from the resist layer 6 and the substrate 4. The silane coupling agent may be a conventional one without particular limitation; a silane coupling agent having an epoxy group is preferably used from the viewpoint of further strengthening the adhesion between the resin pattern and the substrate 4 by incorporating the molecule of the silane coupling agent into the molecule of the resin pattern. The silane coupling agent is exemplified by 3-glycidoxypropyl trimethoxysilane, 3-glycidoxypropyl triethoxysilane, etc. The additive amount of the silane coupling agent is exemplified by 1% to 10% by mass based on the solid content of the cationic polymerization type resist composition.

The solvent is used in order to enhance the sensitivity of the cationic polymerization type resist composition and make the viscosity of the cationic polymerization type resist composition suitable to coat on the surface of the substrate 4. The solvent is exemplified by propyleneglycol monomethylether acetate (PGMEA), methyl isobutyl ketone (MIBK), butyl acetate, methyl amyl ketone (2-heptanone), ethyl acetate, methyl ethyl ketone (MEK), etc. The additive amount of the solvent in the cationic polymerization type resist composition may be appropriately set considering the coating property of the cationic polymerization type resist composition.

Next, the novolak type resist composition (ii) is explained. The novolak type resist composition contains a novolak type resin and a photosensitizing agent, and its solubility in a developer of an alkali aqueous solution increases upon being irradiated with an active energy beam such as UV rays.

The novolak type resin is alkali-soluble. The alkali-soluble novolak type resin may be those commonly used in conventional positive-type photoresist compositions without particular limitation; for example, condensed products between aromatic hydroxyl compounds such as phenol, cresol, xylenol, etc. and aldehydes such as formaldehyde under the presence of an acidic catalyst may be used as the alkali-soluble novolak type resin.

A quinonediazide group-containing compound may be used as the photosensitizing agent. The quinonediazide group-containing compound may be exemplified by complete esterification products or partial esterification products of polyhydroxybenzophenones such as 2,3,4-trihydroxy benzophenone and 2,3,4,4'-tetrahydroxy benzophenone, or tris (hydroxyphenyl)methanes or methyl substitutions thereof described in Japanese Unexamined Patent Application, Publication No. H04-29242 such as 1-[1-(4-hydroxy phenyl)isopropyl]-4-[1,1-bis(4-hydroxy phenyl)ethyl]benzene, 1,4-bis (4-hydroxyphenyl isopropylidenyl)benzene, tris(4-hydroxyphenyl)methane, bis(4-hydroxy-3,5-dimethyl phenyl)-4-hydroxyphenylmethane, bis(4-hydroxy-2,5-dimethyl phenyl)-4-hydroxyphenylmethane, bis(4-hydroxy-3,5-dimethyl phenyl)-2-hydroxyphenylmethane and bis(4-hydroxy-2,5-dimethyl phenyl)-2-hydroxyphenylmethane and naphthoquinone-1,2-diazide-5-sulfonic acid or naphthoquinone-1,2-diazide-4-sulfonic acid. In particular, complete esterification products or partial esterification products of 1-[1-(4-hydroxyphenyl)isopropyl]-4-[1,1-bis(4-hydroxy phenyl)ethyl]benzene, 1,4-bis(4-hydroxyphenyl isopropylidenyl)benzene, tris(hydroxyphenyl)methanes or methyl substitutions thereof described above; and naphthoquinone-1,2-diazide-5-sulfonic acid or naphthoquinone-1,2-diazide-4-sulfonic acid can be preferably used as the photosensitizing agent for excimer lasers or far-UV rays. Other quinonediazide group-containing compounds of reaction products between orthobenzoquinone diazide, orthonaphthoquinone diazide, orthoanthraquinone diazide, orthonaphthoquinone diazide sulfonate esters, or nuclear substitution derivatives, orthoquinone diazide sulfonyl chloride, etc. and hydroxyl or amino group-containing compounds such as phenol, p-methoxyphenol, dimethylphenol, hydroquinone, bisphenol A, naphthol, pyrocatechol, pyrogallol, pyrogallol monomethyl ether, pyrogallol-1,3-dimethyl ether, gallic acid, esterified or etherified gallic acid remaining a part of hydroxyl group, aniline, p-amino diphenylamine, etc. may also be used as the photosensitizing agent. These photosensitizing agents may be used alone or in combination of two or more.

The amount of the novolak type resin is preferably 5 to 200 parts and more preferably 10 to 60 parts by mass based on 10 parts by mass of the photosensitizing agent. The amount used of the novolak type resin is in a range which can bring about good reproducibility of the novolak type resist composition.

Plasticizers, solvents, etc. may be added to the novolak type resist composition depending on a necessary property. Conventional plasticizers can be used as the plasticizer without particular limitation. The plasticizer is exemplified by polymethylvinylether, etc. The solvent may be similar to those explained with respect to the cationic polymerization type resist composition described above.

Preferably, the compound having two or more naphthoquinone diazide groups per molecule is used as the photosensitizing agent since the hydroxyl group in the novolak type resin is cross-linked with the naphthoquinone diazide group in the photosensitizing agent and the solvent resistance of the resin pattern can be improved by irradiating the resulting resin pattern with UV rays as after curing.

Next, the chemically-amplified type resist composition (iii) is explained. The chemically-amplified type resist composition contains at least a resin which has an acid-dissociating elimination group and increases alkali solubility when the elimination group is eliminated by action of an acid generated from a photo-acid-generating agent through exposure and the photo-acid-generating agent. That is, although the resin in the chemically-amplified type resist composition exhibits less alkali solubility prior to exposure since the substituent group for imparting alkali solubility is protected by a protective group, the alkali solubility is enhanced after exposure since the protective group departs and the substituent group for imparting alkali solubility appears by action of the acid generated from the photo-acid-generating agent. By this action, the site of the chemically-amplified type resist composition which is selectively exposed through a photomask is removed to form a resin pattern.

The photo-acid-generating agent is not particularly limited as long as an acid is generated upon being irradiated with an active energy beam such as UV rays, and conventional compounds used heretofore as the photo-acid-generating agent in the chemically-amplified type resist composition can be used. Examples of the photo-acid-generating agent include [2-(propylsulfonyl oxyimino)-2,3-dihydro thiophene-3-ylidene](o-tolyl)acetonitrile (IRGACURE PAG103 (article name), manufactured by Ciba Specialty Chemicals Inc.); bis(sulfonyl)diazomethanes such as bis(p-toluenesulfonyl)diazomethane, methylsulfonyl-p-toluenesulfonyl diazomethane, 1-cyclohexylsulfonyl-1-(1,1-dimethylethyl sulfonyl)diazomethane, bis(1,1-dimethylethyl sulfonyl)diazomethane, bis (1-methylethyl sulfonyl)diazomethane, bis(cyclohexyl sulfonyl)diazomethane, bis(2,4-dimethylphenyl sulfonyl) diazomethane, bis(4-ethylphenyl sulfonyl)diazomethane, bis (3-methylphenyl sulfonyl)diazomethane, bis(4-methoxyphenyl sulfonyl)diazomethane, bis(4-fluorophenyl sulfonyl)diazomethane, bis(4-chlorophenyl sulfonyl)diazomethane, and bis(4-tert-butylphenyl sulfonyl)diazomethane; sulfonylcarbonylalkanes such as 2-methyl-2-(p-toluene sulfonyl)propiophenone, 2-(cyclohexylcarbonyl)-2-(p-toluene sulfonyl)propane, 2-methanesulfonyl-2-methyl-(p-methyl thio)propiophenone, 2,4-dimethyl-2-(p-toluene sulfonyl) pentane-3-one; sulfonyl carbonyl diazomethanes such as 1-p-toluenesulfonyl-1cyclohexylcarbonyl diazomethane, 1-diazo-1-methylsulfonyl-4-phenyl-2-butanone, 1-cyclohexylsulfonyl-1cyclohexylcarbonyl diazomethane, 1-diazo-1-cyclohexyl sulfonyl-3,3-dimethyl-2-butanone, 1-diazo-1(1,1-dimethylethyl sulfonyl)-3,3-dimethyl-2-butanone, 1-acetyl-1(1-methylethyl sulfonyl)diazomethane, 1-diazo-1(p-toluene sulfonyl)-3,3-dimethyl-2-butanone, 1-diazo-1-benzenesulfonyl-3,3-dimethyl-2-butanone, 1-diazo-1(p-toluene sulfonyl)-3-methyl-2-butanone, 2-diazo-2-(p-toluene sulfonyl)cyclohexyl acetate, 2-diazo-2-(benzene sulfonyl)tert-butyl acetate, 2-diazo-2-methanesulfonyl isopropyl acetate, 2-diazo-2-benzene sulfonyl cyclohexyl acetate, and 2-diazo-2-(p-toluene sulfonyl)tert-butyl acetate; nitrobenzyl derivatives such as p-toluenesulfonic acid-2-nitrobenzyl, p-toluenesulfonic acid-2,6-dinitrobenzyl, and p-trifluoromethyl benzenesulfonic acid-2,4-dinitrobenzyl; aliphatic or aromatic sulfonic acid esters of polyhydroxy compounds, such as methane sulfonic acid esters of pyrogallol (pyrogallol trimesilate), benzenesulfonic acid esters of pyrogallol, p-toluenesulfonic acid esters of pyrogallol, p-methoxybenzenesulfonic acid esters of pyrogallol, mesitylenesulfonic acid esters of pyrogallol, benzylsulfonic acid esters of pyrogallol, methane sulfonic acid esters of alkyl gallates, benzenesulfonic acid esters of alkyl gallates, p-toluenesulfonic acid esters of alkyl gallates, p-methoxybenzenesulfonic acid esters of alkyl gallates, mesitylenesulfonic acid esters of alkyl gallates, and benzylsulfonic acid esters of alkyl gallates. Preferably, the alkyl group in the alkyl gallates is an alkyl group having a carbon number of 1 to 15, in particular an octyl group or a lauryl group. The bis(sulfonyl)diazomethanes are preferable among the photo-acid-generating agents described above; in particular, bis(cyclohexyl sulfonyl)diazomethane and bis(2,4-dimethylphenyl sulfonyl)diazomethane are preferably used. These photo-acid-generating agents may be used alone or in combination of two or more.

The resin used in the chemically-amplified type resist composition increases the alkali solubility by action of an acid generated from the photo-acid-generating agent, and conventional synthetic resins used heretofore as a resin component in the chemically-amplified type resist composition can be used. Examples of the resin include a polyacrylic acid of which a part of carboxyl groups is protected by a protective group and a polyhydroxystyrene of which a part of hydroxyl groups is protected by a protective group. The protective group is exemplified by a tert-butoxycarbonyl group, a tert-butyl group, a tert-amyloxycarbonyl group, an alkoxyalkyl group, a tetrahydropyranyl group, a tetrahydrofuranyl group, a 1-ethylcyclohexane-1-yl group, etc.

The amount used of the photo-acid-generating agent used in the chemically-amplified type resist composition may be appropriately set depending on the combination with the resin and is preferably 0.1 to 20 parts by mass based on 100 parts by mass of the resin.

A sensitivity adjuster, a solvent, etc. may be added as required to the chemically-amplified type resist composition. The sensitivity adjuster is added in order to capture a part of acid generated from the photo-acid-generating agent and is used to improve sensitivity or resolution of the resist composition. The sensitivity adjuster (quencher) is exemplified by aliphatic amines, in particular secondary aliphatic amines and tertiary aliphatic amines; specific examples thereof are monoalkylamines such as n-hexylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. The solvent may be similar to those explained above with respect to the cationic polymerization type resist composition.

Next, the radical polymerization type resist composition (iv) is explained. The radical polymerization type resist composition contains at least a monomer and/or a resin having an ethylenically unsaturated bond and a radical polymerization initiator; in which the radical polymerization initiator generates a radical by being irradiated with an active energy beam such as UV rays, and the monomer and/or the resin having an ethylenically unsaturated bond polymerizes by the radical, resulting in higher molecular weight and curing.

The monomer and/or the resin having an ethylenically unsaturated bond may be conventional ones used heretofore in the radical polymerization type resist composition. In this regard, when the monomer having an ethylenically unsaturated bond is used, it is necessary that the number of the ethylenically unsaturated bond per molecule of the monomer is 3 or less. When the number of the ethylenically unsaturated bond in the monomer is 4 or more, the monomer molecule becomes bulky, residual dross generates after development, and reproducibility of the pattern slightly degrades. In usual use, degradation of pattern reproducibility due to the generation of residual dross is not so problematic. However, in the case of fine configuration with adjacent patterns like the comb-shaped electrode produced by the present invention, the generation of residual dross makes it difficult to pull out the pattern exactly in accordance with the shape of the current collectors 2a, 2b, and the shape of the guide holes 7a, 7b described later becomes smaller than the shape of the current collectors 2a, 2b in planar view. Consequently, a sufficient amount of the positive-electrode active material layer 3a and the negative-electrode active material layer 3b cannot be formed on the surface of the current collectors 2a, 2b, resulting in insufficient capacity of the cell. For this reason, when the monomer having an ethylenically unsaturated bond is used, the monomer with 3 or less ethylenically unsaturated bonds per molecules is used in the present invention. Thereby, pattern reproducibility sufficient for producing the comb-shaped electrode with fine configuration can be obtained.

Examples of the resin having an ethylenically unsaturated bond include epoxy(meth)acrylates of a reaction product between epoxy resins such as bisphenol A type epoxy resins, bisphenol F type epoxy resins, phenol novolak type epoxy resins, terminal glycidyl ether of propylene oxide adducts of bisphenol A, and fluorine epoxy resins and (meth)acrylic acids; urethane(meth)acrylates of a reaction product between polyols, organic isocyanates, and hydroxyl group-containing ethylenically unsaturated compounds; and polyester(meth)acrylates of an esterification product between polyols, polybasic acids, and (meth)acrylic acids. These may be used alone or in combination of two or more. In addition, the resin having an ethylenically unsaturated bond may have 4 or more ethylenically unsaturated bonds per molecule in contrast to the monomer having an ethylenically unsaturated bond described above.

In the monomer having an ethylenically unsaturated bond, the number of ethylenically unsaturated bonds per molecule of the monomer is 3 or less. The monomer is exemplified by (meth)acrylamide, methylol(meth)acrylamide, methoxymethyl(meth)acrylamide, ethoxymethyl(meth)acrylamide, propoxymethyl(meth)acrylamide, butoxymethoxymethyl (meth)acrylamide, acrylic acid, maleic acid, maleic anhydride, itaconic acid, itaconic anhydride, citraconic acid, citraconic anhydride, crotonic acid, 2-acrylamide-2-methylpropanesulfonic acid, tert-butylacrylamide sulfonic acid, methyl(meth)acrylate, ethyl(meth)acrylate, butyl(meth)acrylate, 2-ethylhexyl(meth)acrylate, 2-hydroxyethyl(meth)acrylate, 2-hydroxypropyl(meth)acrylate, 2-hydroxybutyl (meth)acrylate, 2-phenoxy-2-hydroxypropyl(meth)acrylate, 2-(meth)acryloyloxy-2-hydroxypropyl phthalate, glycerin mono(meth)acrylate, tetrahydrofurfuryl(meth)acrylate, dimethylamino(meth)acrylate, glycidyl(meth)acrylate, 2,2,2-trifluoroethyl(meth)acrylate, 2,2,3,3-tetrafluoropropyl(meth)acrylate, half (meth)acrylate of phthalic acid derivatives, N-methylol(meth)acrylamide; bisphenol (A, F or S) modified diacrylate such as 2,2-bis[4-{(meth)acryloxy triethoxy}phenyl]propane, 2,2-bis[4-{(meth)acryloxy pentaethoxy}phenyl]propane, 2,2-bis[4-{(meth)acryloxy decaethoxy}phenyl]propane, 2,2-bis[4-{(meth)acryloxy tripropoxy}phenyl]propane, 2,2-bis[4-{(meth)acryloxy pentapropoxy}phenyl]propane, 2,2-bis[4-{(meth)acryloxy pentapropoxy}phenyl]propane, and 2,2-bis[4-{(meth)acryloxy decapropoxy}phenyl]propane which are compounds introduced with two (meth)acryloxy groups into a bisphenol A, F or S type compound; diethylene glycol di(meth)acrylate, tetraethylene glycol di(meth)acrylate, butylene glycol di(meth)acrylate, neopentyl glycol di(meth)acrylate, 1,6-hexane glycol di(meth)acrylate, trimethylolpropane tri(meth) acrylate, glycerin di(meth)acrylate, pentaerythritol di(meth) acrylate, pentaerythritol tri(meth)acrylate, 2,2-bis(4-(meth) acryloxy diethoxyphenyl)propane, 2,2-bis(4-(meth)acryloxy polyethoxyphenyl)propane, 2-hydroxy-3-(meth)acryloyloxypropyl(meth)acrylate, ethylene glycol diglycidylether di(meth)acrylate, diethylene glycol diglycidylether di(meth) acrylate, phthalic acid diglycidylester di(meth)acrylate, glycerin triacrylate, methylene bis(meth)acrylamide, (meth)acrylamide methylene ether, triacrylformal, polyethylene glycol di(meth)acrylate, polypropylene glycol di(meth)acrylate, polyethylene polypropylene glycol di(meth)acrylate, ethylene glycol di(meth)acrylate, propylene glycol di(meth)acrylate, polyethylene polytrimethylolpropane di(meth)acrylate, 2-(meth)acryloyloxy-2-hydroxypropyl phthalate, 2-(meth) acryloyloxyethyl-2-hydroxyethyl phthalate, compounds resulting from reaction of glycidyl group-containing compounds with α,β-unsaturated carboxylic acids, urethane monomers, γ-chloro-β-hydroxypropyl-β'-(meth)acryloyl oxyethyl-o-phthalate, β-hydroxyethyl-β'-(meth)acryloyl oxyethyl-o-phthalate, and β-hydroxypropyl-β'-(meth)acryloyloxyethyl-o-phthalate. These may be used alone or in combination of two or more.

Examples of the compound, resulting from reaction of glycidyl group-containing compounds with α,β-unsaturated carboxylic acids, include triglycerol di(acrylate), without particular limitation thereto.

Examples of the urethane monomer include addition reaction products of (meth)acryl monomers having an OH group at β position and isophorone diisocyanate, 2,6-toluene diisocyanate, 2,4-toluene diisocyanate, or 1,6-hexamethylene diisocyanate, EO modified urethane di(meth)acrylate, EO, PO modified urethane di(meth)acrylate, etc.

The radical polymerization initiator may be conventional ones used heretofore in the radical polymerization type resist composition. Examples of the radical polymerization initiator include thioxanthone derivatives such as 2,4-diethyl thioxanthone, isopropyl thioxanthone, 2-chloro thioxanthone, and 2,4-dimethyl thioxanthone; aromatic ketones such as benzophenone, N,N'-tetramethyl-4,4'-diamino benzophenone, N,N'-tetraethyl-4,4'-diamino benzophenone, 4-methoxy-4'-dimethylamino benzophenone, 2-benzyl-2-dimethylamino-1-(4-morpholino phenyl)-butanone-1,2-methyl-1-[4-(methyl thio)phenyl]-2-morpholino-propanone-1; quinones such as 2-ethylanthraquinone, phenanthrenequinone, 2-tert-butylanthraquinone, octamethyl anthraquinone, 1,2-benzanthraquinone, 2,3-benzanthraquinone, 2-phenylanthraquinone, 2,3-diphenylanthraquinone, 1-chloroanthraquinone, 2-methyanthraquinone, 1,4-naphthoquinone, 9,10-phenanthraquinone, 2-methyl-1,4-naphthoquinone, and 2,3-dimethylanthraquinone; benzoin ether compounds such as benzoin methylether, benzoin ethylether, and benzoin phenylether; benzoin compounds such as benzoin, methylbenzoin and ethylbenzoin; benzyl derivatives such as benzyl dimethyl ketal; 2,4,5-triaryl imidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, and 2,4,5-triarylimidazole dimer; acridine derivatives such as 9-phenylacridine and 1,7-bis(9,9'-acridinyl)heptane; oxime esters such as ethanone, 1-[9-ethyl-6-(2-methylbenzoyl)-9H-carbazol-3-yl]-, 1-(o-acetyloxime); N-phenylglycine; and coumalin compounds. The radical polymerization initiators may be used alone or in combination of two or more.

The amount used of the radical polymerization initiator is preferably 1 to 10 parts and more preferably 1 to 5 parts by mass based on 100 parts by mass of the monomer and/or the resin having an ethylenically unsaturated bond. When the amount used of the radical polymerization initiator is within the range described above, the radical polymerization type resist composition can be provided with good curability, and an increase in cost due to excessive addition of the radical polymerization initiator can be suppressed.

The radical polymerization type resist composition may be added with resin compositions having no ethylenically unsaturated bond, silane coupling agents, polymerization inhibitors, solvents, etc. as required. The resin composition having no ethylenically unsaturated bond is added in order to improve developing property and exemplified by a (meth) acrylic resin of which a carboxyl group at side chain may be esterified by alcohols.

The silane coupling agent is added in order to impart the adhesion between the resin pattern formed of the resist layer 6 and the substrate 4. The silane coupling agent may be a conventional one without particular limitation; and silane coupling agents having an ethylenically unsaturated bond are preferably used from the viewpoint of further strengthening the adhesion between the resin pattern and the substrate 4 by incorporating the molecule of the silane coupling agent into the molecule of the resin pattern. The silane coupling agent is exemplified by 3-methacryloxypropyl trimethoxysilane, 3-methacryloxypropyl methyldimethoxysilane, 3-methacryloxypropyl methyldiethoxysilane, 3-methacryloxypropyl triethoxysilane, p-styryltriethoxysilane, etc. The additive amount of the silane coupling agent is exemplified by 1% to 10% by mass in a ratio of solid content based on the radical polymerization type resist composition.

The polymerization inhibitor is added in order to suppress halation phenomena during exposure. The polymerization inhibitor may be a conventional one without particular limitation. The polymerization inhibitor is exemplified by 1,5-dihydroxy naphthalene, 1,4-dihydroxy naphthalene, 2,3-dihydroxy naphthalene, 1,6-dihydroxy naphthalene, 1,3-dihydroxy naphthalene, 1,8-dihydroxy naphthalene, etc. The additive amount of the polymerization inhibitor is exemplified by 0.1% to 5% by mass in a ratio of solid content based on the radical polymerization type resist composition. The solvent may be similar to those explained above as to the cationic polymerization type resist composition.

Guide Hole Forming Step

Next, the guide hole forming step is explained. The guide hole forming step is carried out after the resist coating step and shown by FIG. 2H. In addition, as to FIG. 2H, a current collector 2a at bottom of a guide hole 7a is omitted considering viewability thereof.

In this step of this embodiment, guide holes 7a, 7b having the same shape in planar view as that of the comb-shaped current collectors 2a, 2b are formed in the resist layer 6 formed in the resist coating step described above. The guide holes 7a, 7b are formed as through holes which penetrate the resist layer 6 to the surface of the current collectors 2a, 2b. The guide holes 7a, 7b are used as casting molds in order to deposit a positive-electrode active material or a negative-electrode active material in the active material layer forming step explained later.

In this step of this embodiment, initially, the resist layer 6 formed in the resist coating step described above is selectively exposed through a mask having the same shape in planar view as that of the comb-shaped current collectors 2a, 2b. Thereby, when the resist layer 6 is formed from a negative resist, the part that is not the future guide holes 7a, 7b cures and becomes insoluble in the developer and the parts to be the future guide holes 7a, 7b retain their solubility. Additionally, when the resist layer 6 is formed from a positive resist, the parts to be the future guide holes 7a, 7b cure and become soluble in the developer and the parts not to be the future guide holes 7a, 7b retain their insolubility.

The selectively exposed resist layer 6 is developed. The development is carried out by conventional processes using conventional developers. The developer is exemplified by alkaline aqueous solutions. The developing process is exemplified by immersion processes, spray processes, etc.

In the developed resist layer 6, guide holes 7a, 7b having the same shape in planar view as that of the comb-shaped current collectors 2a, 2b are formed up to the surface of the current collectors 2a, 2b. If necessary, after curing by irradiation with an active energy beam such as UV rays or post baking as additional heat treatment is applied to the resist layer 6 where the guide holes 7a, 7b have been formed. The solvent resistance or the plating solution resistance of the resist later 6 necessary at the active material layer forming step described later is further improved by applying the after curing or post baking.

Active Material Layer Forming Step

Figure 2I:
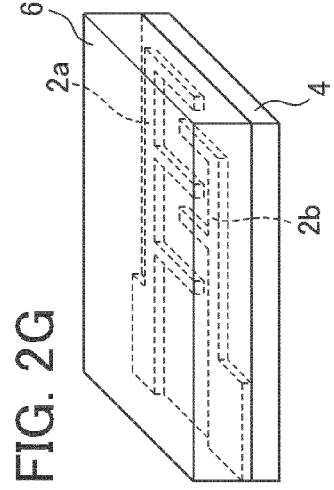

Next, the active material layer forming step is explained. The active material layer forming step is carried out after the guide hole forming step and is shown by FIG. 2I.

In this step, the positive-electrode active material layer 3a on the surface of the current collector 2a and the negative-electrode active material layer 3b on the surface of the current collector 2a are respectively formed using the guide holes 7a, 7b formed in the guide hole forming step as casting molds thereof. Consequently, the comb-shaped electrodes 1a, 1b are completed.

The process of forming the active material layers 3a, 3b on the surfaces of the current collectors 2a, 2b using the guide holes 7a, 7b as casting molds thereof is exemplified by electrophoresis or plating processes. These processes are explained below.

In the electrophoresis process, particles of the positive-electrode or negative-electrode active material dispersed in a solvent are selectively deposited on a voltage-applied surface of the current collector by immersing the substrate 4 with the guide holes 7a, 7b in a polar solvent dispersing the particles of the positive-electrode or negative-electrode active material and applying a voltage to one of the current collectors 2a, 2b. Thereby, the active material layer 3a or 3b can be deposited on an optional one of the current collectors 2a, 2b using the guide holes 7a, 7b as casting molds thereof.

The active material dispersed in a solvent is exemplified by particles of positive-electrode active materials such as $LiCoO_2$, $LiFePO_4$, and $LiMn_2O_4$ and particles of negative-electrode active materials such as graphite, $Li_4Ti_5O_{12}$, Sn alloys and Si compounds having a particle diameter of 100 to 10,000 nm, preferably 100 to 1,000 nm. Furthermore, the amount of the active material dispersed in a solvent is exemplified by 1 to 50 g/L; and the solvent is exemplified by acetonitrile, N-methylpyrrolidone, acetone, ethanol, and water. Additionally, the solvent may be added with conductive aids and binders such as carbon black, polyvinylidene fluoride, and iodine. The amount of the conductive aids or binders in the solvent is exemplified by 0.1 to 1 g/L.

The electrophoresis process can be performed by using a substrate of nickel, gold, etc. at about 1 cm above the current collectors 2a, 2b as an opposite electrode. The voltage is exemplified by 1 to 1,000 V. The electric field between the collectors 2a and 2b or between the current collector 2a or 2b and an electrode facing the current collector 2a or 2b is exemplified by 1 to 1,000 V/cm.

In the plating process, the active material layer 3a or 3b is formed on the surface of the current collector 2a or 2b using an aqueous plating solution. The plating solution is exemplified by a 0.01 to 0.3 mol/L aqueous solution of $SnCl_2.2H_2O$, a 0.01 to 0.3 mol/L aqueous solution of mixture of $SnCl_2.2H_2O$ and $NiCl_2.6H_2O$, a 0.01 to 0.3 mol/L aqueous solution of mixture of $SnCl_2.2H_2O$ and $SbCl_3$, a 0.01 to 0.3 mol/L aqueous solution of mixture of $SnCl_2.2H_2O$ and $CoCl_2$, and a 0.01 to 0.3 mol/L aqueous solution of mixture of $SnCl_2.2H_2O$ and $CuSO_4$. Furthermore, glycine, $K_4P_2O_7$, $NH_4OH$ aqueous solution, etc. in a concentration of 0.01 to 0.5 mol/L may be added to the plating solution as an additive.

After the active material layer 3a or 3b has selectively been formed on one of the current collectors 2a, 2b by the electrophoresis process, an active material layer 3b or 3a may be formed on another current collector 2b or 2a where the active material layer 3a or 3b has not been formed by the plating process, without particular limitation thereto. In this way, the positive-electrode active material layer 3a and the negative-electrode active material layer 3b can be selectively formed on the surfaces of the current collector 2a and the current collector 2b, respectively.

Furthermore, in addition to the electrophoresis or plating process for forming the active material layer 3a or 3b on the surface of the current collector 2a or 2b, an injection process can be applied in which a solution dispersing the particles of the positive-electrode or negative-electrode active material in a solvent is injected into the guide hole 7a or 7b.

As described above, the active material layers 3a, 3b are formed by the electrophoresis process, the plating process, etc. using the guide holes 7a, 7b formed in the resist layer 6 as casting molds thereof. It is preferred for this reason that the resist layer 6 in the active material layer forming step has resistance to the solvent used in the electrophoresis process or the plating solution used in the plating process. From the viewpoint of imparting the resistance to the plating solution, the cationic polymerization type resist composition (i), the novolak type resist composition (ii), and the chemically-amplified type resist composition (iii) are preferable among the resist compositions (i) to (iv). Furthermore, from the viewpoint of imparting the resistance to the solvent used in the electrophoresis process, the cationic polymerization type resist composition (i) is more preferable.

After forming the active material layers 3a, 3b on the surfaces of the current collectors 2a, 2b, the resist layer 6 where the guide holes 7a, 7b have been formed are removed. Consequently, the comb-shaped electrodes 1a, 1b shown in FIG. 1 are formed. The process of removing the resist layer 6 is exemplified by ashing processes to decompose the resist layer by heating to high temperatures, and etching processes.

Figure 4:
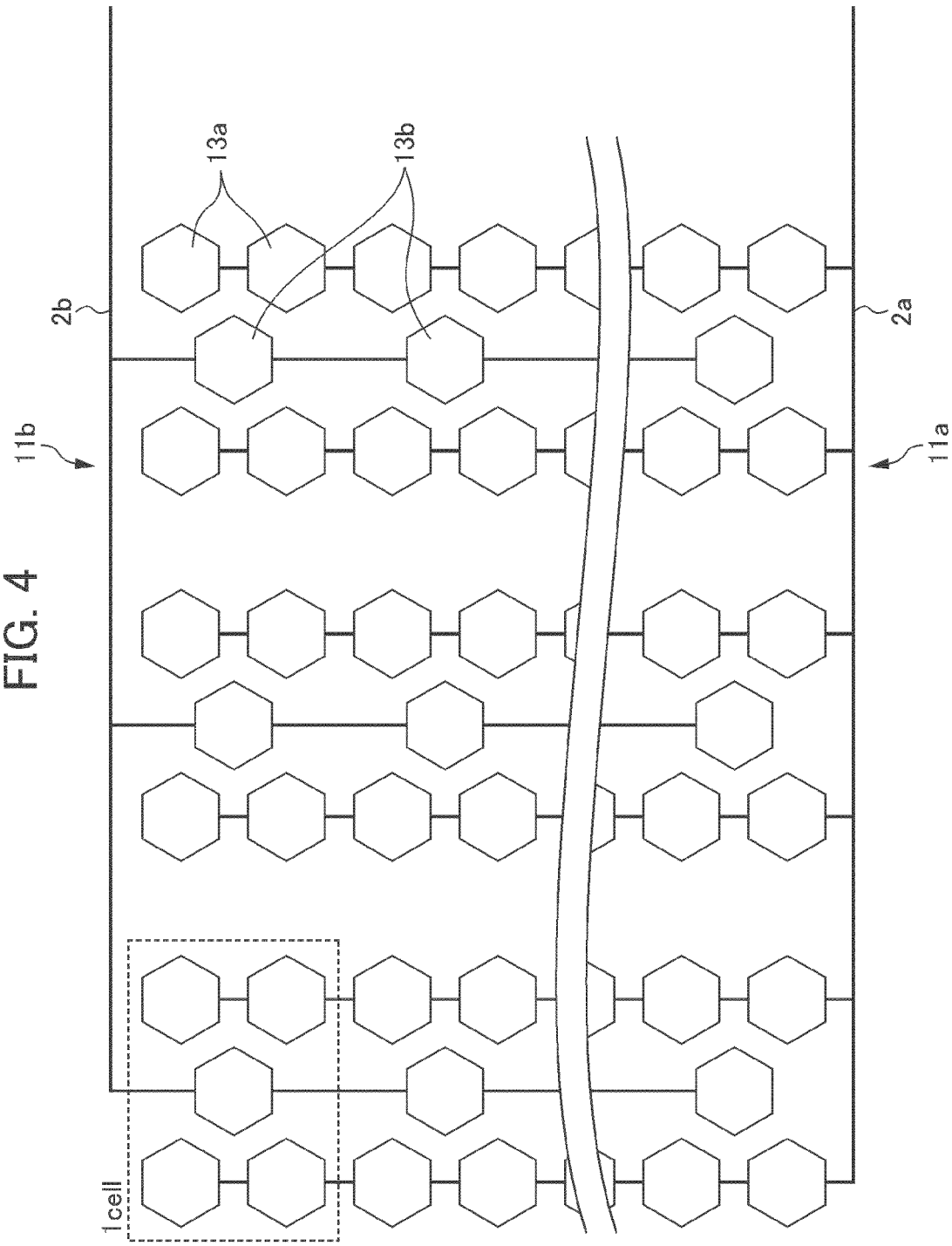
FIG. 4 is a plan view schematically showing a comb-shaped electrode (positive-electrode active material 13a: negative-electrode active material 13b=4:1) which is produced in accordance with the second embodiment of the method for producing a comb-shaped electrode of the present invention.

Next, the second embodiment of the method for producing a comb-shaped electrode of the present invention is explained below with reference to figures. FIGS. 3 and 4 are plan views schematically showing a comb-shaped electrode which is produced in accordance with the second embodiment of the method for producing a comb-shaped electrode of the present invention. In the explanation with reference to this embodiment, the same reference symbols are used to the constructions similar to those of the first embodiment described above and their explanations are omitted.

In the comb-shaped electrodes 11a, 11b of this embodiment, active material layers 13a, 13b are formed as two or more polygonal-shaped bodies of island configuration on the surface of the comb-shaped current collectors 2a, 2b.

The positive-electrode active material layers 13a formed as two or more polygonal-shaped bodies of island configuration are provided along each of the teeth of the comb-shaped current collector 2a. Here, each of the positive-electrode active material layers 13a is provided to partially contact the current collector 2a. Thereby, the current generated by an electrode reaction of the positive-electrode active material layers 13a can flow from the current collector 2a.

The negative-electrode active material layers 13b formed as two or more polygonal-shaped bodies of island configuration are provided along each of the teeth of the comb-shaped current collector 2b. Here, each of the negative-electrode active material layers 13b is provided to partially contact the current collector 2b. Thereby, the current generated by an electrode reaction of the positive-electrode active material layers 13b can flow from the current collector 2b.

The positive-electrode active material layers 13a and the negative-electrode active material layers 13b are respectively formed along the surfaces of the current collectors 2a, 2b which are oppositely disposed so that the parts of teeth of the comb shapes are alternatively arranged. Therefore, each of the positive-electrode active material layers 13a and each of the negative-electrode active material layers 13b are oppositely disposed so that the teeth of the comb shapes are alternatively arranged; and as a whole, the positive electrode 11a and the negative electrode 11b are oppositely disposed so that the parts of teeth of the comb shapes are alternatively arranged. As such, this embodiment to form the comb-shaped electrode in this way is also one of the present invention. The procedures to form the positive electrode 11a and the negative electrode 11b are similar to those of the first embodiment, therefore explanation thereof is omitted. Additionally, the materials to construct the positive-electrode active material layer 13a and the negative-electrode active material layer 13b are similar to those of the positive-electrode active material layer 3a and the negative-electrode active material layer 3b, therefore explanation thereof is omitted.

The planar shape of the positive-electrode active material layer 13a and the negative-electrode active material layer 13b is not particularly limited and may be polygonal as shown in FIGS. 3, 4, round, etc. When the planar shape of the positive-electrode active material layer 13a and the negative-electrode active material layer is polygonal, the polygonal is exemplified by equilateral triangle, square, equilateral pentagon, regular hexagon, etc.; in particular, regular hexagon is preferable. Due to the regular hexagon of the planar shape of the positive-electrode active material layer 13a and the negative-electrode active material layer 13b, the positive-electrode active material layers 13a and the negative-electrode active material layers 13b can be orderly disposed to make the spaces therebetween approximately identical, therefore, migration length of charged substances such as lithium ion between these active material layers can be shortened. Thereby, the current obtained from secondary cells can be increased. Furthermore, when the negative-electrode active material layer 13b is formed from materials other than carbon, the negative-electrode active material layer 13b generates a large volume change along with input/output of charged substances such as lithium ion by charge and discharge and the volume change may cause cracks in the negative-electrode active material layer 13b; however, the shape described above can suppress the generation of cracks in the negative-electrode active material layer 13b due to the volume change. In addition, even when the negative-electrode active material layer 13b is formed from materials with less volume change such as carbon and $Li_4Ti_5O_{12}$, there is no difference therebetween in the viewpoint that these materials generate some volume change along with charge and discharge, therefore, the generation of cracks can be further suppressed in the comb-shaped electrode of the present invention compared to conventional electrodes and the effect of the present invention can be achieved.

Incidentally, the cumulative amount of charged substances such as lithium ion on every negative-electrode active material layers 13b depends on the material of the negative-electrode active material layers 13b. For this reason, it is preferred that the mass ratio of the positive-electrode active material layer 13a in the positive electrode 11a to the negative-electrode active material layer 13b in the negative electrode 11b (hereinafter, referred to as "ratio of positive electrode/negative electrode") is appropriately set considering the theoretical capacity based on the material of the positive-electrode active material layer 13a and the theoretical capacity based on the material of the negative-electrode active material layer 13b and then the balance of both capacities is adjusted.

The decision of the mass ratio is explained in the case of forming the positive-electrode active material layer 13a from $LiCoO_2$, for example. The positive-electrode theoretical capacity of $LiCoO_2$ is 140 mAh/g.

In this example, the ratio of positive electrode/negative electrode is preferably about 1:1 when the negative-electrode active material layer 13b is constructed from carbon (negative-electrode theoretical capacity: 360 mAh/g), the ratio of positive electrode/negative electrode is preferably about 2:1 to 3:1 when the negative-electrode active material layer 13b is constructed from alloy materials (Sn type, negative-electrode theoretical capacity: 800 to 900 mAh/g), and the ratio of positive electrode/negative electrode is preferably about 4:1 to 5:1 when the negative-electrode active material layer 13b is constructed from silicon materials (SiC, $SiO_2$, negative-electrode theoretical capacity: 2000 mAh/g).

The process to adjust the ratio of positive electrode/negative electrode, which is not particularly limited, is exemplified by increasing the mass per active material layer of one of the positive and negative electrodes and decreasing the mass per active material layer of other electrode, increasing the number of active material layers of one of the positive and negative electrodes compared to the number of other active material layers, and the like.

FIGS. 3 and 4 show a state in which the number of the positive-electrode active material layers 13a is larger than the number of the negative-electrode active material layers 13b in order to adjust the ratio of positive electrode/negative electrode. In FIG. 3, the number of the positive-electrode active material layers 13a and the negative-electrode active material layers 13b is adjusted so that positive-electrode active material layers 13a:negative-electrode active material layers 13b=2:1. In this case, one set of two positive-electrode active material layers 13a and one negative-electrode active material layer 13b within the area encircled by the broken line in FIG. 3 constitute one cell unit. In FIG. 4, the number of the positive-electrode active material layers 13a and the negative-electrode active material layers 13b is adjusted so that positive-electrode active material layers 13a:negative-electrode active material layers 13b=4:1. In this case, one set of four positive-electrode active material layers 13a and one negative-electrode active material layer 13b within the area encircled by the broken line in FIG. 4 constitute one cell unit.

The size per positive-electrode active material layer 13a or negative-electrode active material layer 13b is not particularly limited, and the maximum diameter thereof is preferably about 80 to 120 μm and most preferably about 100 μm from the view point of suppressing generation of cracks in the active material layers. The alignment interval of the positive-electrode active material layers 13a and the negative-electrode active material layers 13b, which is also not particularly limited, is preferably about 10 to 50 μm and most preferably about 20 μm. In addition, the alignment interval herein refers to the distance between the positive-electrode active material layer 13a and the negative-electrode active material layer 13b in adjacent relation.

The number of cell units in the comb-shaped electrode may be properly set considering the alignment area of the comb-shaped electrode and the necessary cell capacity. For example, one cell unit or more or 10 cell units or more are aligned in the bridge direction of the comb shape consisting of a bridge and teeth, and one cell unit or more or 10 cell units or more are aligned in tooth direction of the comb shape, without any specific limitation thereto.

Specific sizes of the comb-shaped electrode fabricated in this embodiment are shown in FIG. 5. FIG. 5 is a plan view schematically showing a comb-shaped electrode which is produced in accordance with the second embodiment of the method for producing a comb-shaped electrode of the present invention. FIG. 5 shows a comb-shaped electrode which has a configuration of a cell unit consisting of only four positive-electrode active material layers 13a and one negative-electrode active material layer 13b from the viewpoint of easy understanding by simplification. In this embodiment, by including the guide hole forming step and the active material layer forming step described above, even the secondary cell having the fine comb-shaped electrodes as shown in FIG. 5 can be fabricated with good repeatability.

In accordance with the present invention, the electrodes having a fine configuration of comb shape and active material layers thereon can be formed with good repeatability. The electrodes can be formed into a minute size, therefore, are favorably used for built-in type secondary cells in micro machines, etc.

EXAMPLES

The present invention is explained more specifically with reference to examples hereinafter; however, the present invention is not limited to the examples at all.

Example 1

To 48 parts by mass of a cresol-type novolak resin (m-cresol:p-cresol=6:4 (mass ratio), mass average molecular mass: 20,000), 12 parts by mass of a copolymer of p-hydroxy-styrene and styrene (hydroxystyrene:styrene=85:15 (mass ratio), mass average molecular mass: 2,500), 40 parts by mass of a copolymer of acrylic acid 1-ethylcyclohexyl ester, butyl acrylate, acrylic acid and 2-methoxyethyl acrylate (composition ratio: 10:2:1:8 (mass ratio), mass average molecular mass: 250,000), 1 parts by mass of [2-(propylsulfonyl oxy-imino)-2,3-dihydrothiophene-3-ylidene](o-tolyl)acetonitrile (IRGACURE PAG103 (article name), manufactured by Ciba Specialty Chemicals Inc.) as a photo-acid-generating agent and 0.1 parts by mass of triethanolamine, propylene glycol monomethyl ether acetate (PGMEA) was added as a solvent in a solid content of 40% by mass, followed by mixing and dissolving thereof, thereby preparing a resist composition of Example 1. The resist composition of Example 1 is a chemically-amplified and positive type.

Example 2

To 70 parts by mass of a cresol-type novolak resin (m-cresol:p-cresol=6:4 (mass ratio), mass average molecular mass: 30,000), 15 parts by mass of naphthoquinone-1,2-di-azido-5-sulfonic acid diester of 1,4-bis(4-hydroxyphenyl iso-propylidenyl)benzene as a photosensitizing agent and 15 parts by mass of polymethyl vinyl ether (mass average molecular mass: 100,000) as a plasticizer, PGMEA was added as a solvent in a solid content of 40% by mass, followed by mixing and dissolving thereof, thereby preparing a resist composition of Example 2. The resist composition of Example 2 is a novolak and positive type.

Example 3

To 100 parts by mass of 8-functional bisphenol A novolak-type epoxy resin (manufactured by Japan Epoxy Resin Co., product name: jER157S70), 3 parts by mass of 4-(2-chloro-4-benzoylphenylthio)phenyl bis(4-fluorophenyl)sulfonium hexafluoro antimonate as a cationic polymerization initiator (manufactured by ADEKA Co., SP-172), 1 parts by mass of 1-naphthol as a sensitizer and 5 parts by mass of 3-glycidox-ypropyl trimethoxysilane, PGMEA was added as a solvent in a solid content of 70% by mass, followed by mixing and dissolving thereof, thereby preparing a resist composition of Example 3. The resist composition of Example 3 is a cationic polymerization and negative type.

Example 4

One hundred parts by mass as resin solid content of a copolymer of benzyl methacrylate and methacrylic acid in a mass ratio of 80:20 (mass average molecular mass: 80,000, 50% by mass solution of methyl ethyl ketone50), ethoxylated bisphenol A dimethacrylate (manufactured by Shin-Naka-mura Chemical Co., product name: BPE500) as a bi-functional monomer and 3.5 parts by mass of 2,4-diethylthioxan-thone (manufactured by Nippon Kayaku Co., product name: DETX-S) as a radical polymerization initiator were mixed and dissolved, thereby preparing a resist composition of Example 4. The resist composition of Example 4 is a radical polymerization and negative type.

Comparative Example 1

To 40 parts by mass of a copolymer (mass average molecular mass: 45,000) of 3,4-epoxycyclohexyl methyl methacry-late:styrene:3-trimethoxysilyl propylmethacrylate=60:35:5 (mass ratio), 2 parts by mass of a radical polymerization initiator (manufactured by Ciba Specialty Chemicals Inc., product name: CGI-242), 10 parts by mass of 3-methacrylox-ypropyl trimethoxy silane, 50 parts by mass of dipentaeryth-ritol hexaacrylate (product name: DPHA, manufactured by Daicel Cytec Co.) as a 6-functional monomer and 0.8 parts by mass of 1,5-dihydroxy naphthalene as a polymerization inhibitor, PGMEA was added as a solvent in a solid content of 50% by mass, followed by mixing and dissolving thereof, thereby preparing a resist composition of Comparative Example 1. The resist composition of Comparative Example 1 is a radical polymerization and negative type.

Preparation of Test Piece for Evaluation

Test Example 1

A copper layer of 500 nm thick was formed on a surface of 5 inch silicon wafer by a sputtering process. Then, the resist composition of Example 1 was coated on the surface of the resulting copper layer and the solvent in the resist composition was evaporated to form a resist layer of 20 μm thick. The resist layer was irradiated with UV rays (ghi mixed rays, 300 mJ/cm$^2$) through a mask, followed by developing with an alkaline developer and rinsing with pure water. Thereby, the test piece of Test Example 1 was obtained.

Test Example 2

A copper layer of 500 nm thick was formed on a surface of 5 inch silicon wafer by a sputtering process. Then, the resist composition of Example 2 was coated on the surface of the resulting copper layer and the solvent in the resist composition was evaporated to form a resist layer of 20 μm thick. The resist layer was irradiated with UV rays (ghi mixed rays, 3000 mJ/cm$^2$) through a mask, followed by developing with an alkaline developer and rinsing with pure water. Thereby, the test piece of Test Example 2 was obtained.

Test Example 3

A copper layer of 500 nm thick was formed on a surface of 5 inch silicon wafer by a sputtering process. Then, the resist composition of Example 2 was coated on the surface of the resulting copper layer and the solvent in the resist composition was evaporated to form a resist layer of 20 μm thick. The resist layer was irradiated with UV rays (ghi mixed rays, 3000 mJ/cm$^2$) through a mask, followed by developing with an alkaline developer and rinsing with pure water. Then, the resulting resin pattern was irradiated with UV rays (ghi mixed rays) for 10 minutes as after curing. Thereby, the test piece of Test Example 3 was obtained.

Test Example 4

A copper layer of 500 nm thick was formed on a surface of 5 inch silicon wafer by a sputtering process. Then, the resist composition of Example 3 was coated on the surface of the resulting copper layer and the solvent in the resist composition was evaporated to form a resist layer of 20 μm thick. The resist layer was irradiated with UV rays (ghi mixed rays, 300 mJ/cm$^2$) through a mask, followed by developing with an alkaline developer and rinsing with pure water. Thereby, the test piece of Test Example 4 was obtained.

Test Example 5

A copper layer of 500 nm thick was formed on a surface of 5 inch silicon wafer by a sputtering process. Then, the resist composition of Example 4 was coated on the surface of the resulting copper layer and the solvent in the resist composition was evaporated to form a resist layer of 20 μm thick. The resist layer was irradiated with UV rays (ghi mixed rays, 300 mJ/cm$^2$) through a mask, followed by developing with an alkaline developer and rinsing with pure water. Thereby, the test piece of Test Example 5 was obtained.

Comparative Test Example 1

A copper layer of 500 nm thick was formed on a surface of 5 inch silicon wafer by a sputtering process. Then, the resist composition of Comparative Example 1 was coated on the surface of the resulting copper layer and the solvent in the resist composition was evaporated to form a resist layer of 20 μm thick. The resist layer was irradiated with UV rays (ghi mixed rays, 300 mJ/cm$^2$) through a mask, followed by developing with an alkaline developer and rinsing with pure water. Thereby, the test piece of Comparative Test Example 1 was obtained.

Evaluation of Patterning Property

Each of the test pieces of Test Examples 1 to 5 and Comparative Test Example 1 was evaluated in terms of existence or nonexistence of residual dross by observing the resulting resin pattern with a microscope. From the results of observation, those with no residual dross were evaluated as good patterning property (A) and those with residual dross were evaluated as unsatisfactory patterning property (B). The results are shown in Table 1.

Plating Solution Resistance

A plating solution (manufactured by EEJA Co., Microfab Au100) was prepared, and each of the test pieces of Test Examples 1 to 5 and Comparative Test Example 1 was immersed in the plating solution at 60° C. for 30 minutes. Then, the resin patterns at the surfaces of the test pieces were observed by a microscope, and existence or nonexistence of crack generation in the resin patterns due to immersion in the plating solution was examined. Those with no crack were evaluated as good plating solution resistance (A) and those with crack were evaluated as unsatisfactory plating solution resistance (B). The results are shown in Table 1.

Solvent Resistance

Pure water, methanol, ethanol, isopropyl alcohol (IPA), propylene glycol (PG), dibutyl ether (DBE), acetonitrile, toluene and m-xylene were prepared as evaluating solvents. Each of these evaluating solvents was used and evaluation of solvent resistance was carried out by the process below. In addition, concerning Test Example 5 and Comparative Test Example 1, the test of solvent resistance was not carried out since the result of the earlier test of plating solution resistance was no-good.

i) Concerning each of Test Examples 1 to 4, one or two drops of the evaluating solvent was placed on the surface of the resulting resin pattern with a dropper at room temperature.

ii) Solvents other than pure water and propylene glycol were removed by natural drying after dropping. Propylene glycol was removed by rinsing with pure water after 5 minutes from dropping and air-drying while blowing nitrogen. Pure water was removed by air-drying while blowing nitrogen after 5 minutes from dropping.

iii) The surface of the resin pattern after removing the solvent was observed by a metallograph, and evaluated as good solvent resistance (A) when film reduction was not observed for the resin pattern and as unsatisfactory solvent resistance (B) when film reduction was observed for the resin pattern. The results are shown in Table 1.

TABLE 1

|  | Test Example 1 | Test Example 2 | Test Example 3 | Test Example 4 | Test Example 5 | Comparative Test Example 1 |
|---|---|---|---|---|---|---|
| Used Resist Composition | Example 1 | Example 2 | Example 2 with UV Cure | Example 3 | Example 4 | Comparative Example 1 |
| Patterning Property | A | A | A | A | A | B |
| Plating Solution Resistance | A | A | A | A | B | B |
| Solvent Resistance |  |  |  |  |  |  |
| Pure Water | A | A | A | A | — | — |
| Methanol | B | B | A | A | — | — |
| Ethanol | B | B | A | A | — | — |
| IPA | B | B | A | A | — | — |
| PG | A | A | A | A | — | — |
| Acetonitrile | B | B | B | A | — | — |
| DBE | A | A | A | A | — | — |
| Toluene | B | A | A | A | — | — |
| m-Xylene | A | A | A | A | — | — |

As shown in Table 1, the cationic polymerization type resist composition (Test Example 4), the novolak type resist composition (Test Examples 2 and 3), the chemically-amplified type resist composition (Test Example 1), and the radical polymerization type resist composition using a tri- or less functional monomer (Test Example 5) exhibited good patterning property; therefore, it is understood to be appropriate for producing an electrode with fine configuration in accordance with the present invention. In contrast, the radical polymerization type resist composition using a monomer of above tri-functionality (Comparative Test Example 1) exhibited unsatisfactory patterning property; therefore, it is understood to be not appropriate for producing an electrode with fine configuration in accordance with the present invention.

Furthermore, as shown in Table 1, the cationic polymerization type resist composition (Test Example 4), the novolak type resist composition (Test Examples 2 and 3), and the chemically-amplified type resist composition (Test Example 1) have good plating solution resistance; therefore, it is understood to be appropriate for forming an active material layer by plating. Additionally, among these resist compositions, the cationic polymerization type resist composition (Test Example 4) exhibits excellent solvent resistance; therefore, it is understood to be appropriate for forming an active material layer by an electrophoresis process.

Fabrication of Comb-Shaped Electrode

Since the plating solution resistance and the solvent resistance were good in Test Examples 3 and 4, a comb-shaped electrode was fabricated using the resist composition of Example 2 or 3 in Test Example 3 or 4. In addition, the comb-shaped electrode corresponds to the first embodiment of the method for producing a comb-shaped electrode of the present invention described above.

Initially, a titanium film and a gold film were formed respectively in 50 nm thick and 100 nm thick sequentially on a surface of a 5 inch silicon wafer by a sputtering process. Next, a resist composition (manufactured by Tokyo Ohka Kogyo Co., product name: TFR-940PM) was coated on the resulting gold film by a spin coating process (1580 rpm, 25 seconds) and pre-baked at 120° C. for 60 seconds. Then, using a mask having a pair of oppositely-formed comb shapes in which the comb shapes have 100 pairs of teeth (the number of teeth in one comb-shaped electrode: 100), a pattern thickness of 20 μm and a space gap of 10 nm, the resist composition was selectively exposed (ghi mixed rays, exposure amount: 600 mJ/cm$^2$, hard contact) and developed by an alkaline developer, and the resulting resin pattern was post-baked at 130° C. for 180 seconds. Then, the silicon wafer with the pattern was immersed in a KI/I$_2$ aqueous solution (water:KI:I$_2$=40:4:1 (mass ratio)) to etch the part where the surface was exposed among the gold film formed as described above, rinsed with de-ionized water, immersed in a hydrofluoric acid aqueous solution (0.2% by mass) to etch the titanium film which was exposed because the gold film had been removed, and rinsed with de-ionized water. Thereafter, the silicon wafer was immersed in acetone to peel the resin pattern; thereby, a pair of comb-shaped current collectors was formed on the surface of the silicon wafer. Two silicon wafers were fabricated in this way.

Fabrication of Guide Hole Using Resist Composition of Example 2

Using one of the silicon wafers with the comb-shaped current collectors, a guide hole was fabricated using the resist composition of Example 2. Initially, the resist composition of Example 2 was coated on the surface of the silicon wafer with the current collector by a spin coating process to form a resist layer of 30 μm thick and pre-baked at 120° C. for 6 minutes. Then, the resist layer at the position above the comb-shaped current collector was exposed (ghi mixed rays, exposure amount: 3,000 mJ/cm$^2$, hard contact) using a positive mask having the same shape in planar view as that of the current collector. After developing by an alkali developer, the resulting pattern was irradiated with UV rays (ghi mixed rays) for 10 minutes as after curing. Thereby, a pair of comb-shaped guide holes was formed on the surface of the silicon wafer. In addition, comb-shaped current collectors were exposed at bottom of the guide holes.

Fabrication of Guide Hole Using Resist Composition of Example 3

A pair of comb-shaped guide holes was formed on a surface of a silicon wafer in the same way as the case of the resist composition of Example 2 except for using the resist composition of Example 3.

Deposition of Active Material Layer

With respect to each of the silicon wafers in which guide holes were formed using the resist composition of Example 2 or 3, after a positive-electrode active material layer was deposited on one surface of the pair of comb-shaped current collectors by an electrophoresis process, a negative-electrode active material layer was deposited on another surface of the current collector by a plating process.

The deposition of the positive-electrode active material layer by an electrophoresis process was carried out by immersing in acetone containing a dispersion of LiCoO$_2$ particles at a concentration of 10 g/L and containing 0.6 g/L of carbon black (ketjen black) as a conductive aid, 0.4 g/L of polyvinylidene fluoride as a binder and iodine at a concentration of 0.2 g/L, and applying a voltage between one comb-shaped current collector and another opposing current collector. The operation of applying a voltage for one second to generate an electric field intensity of 100 V/cm was repeated 5 times. Then, the negative-electrode active material layer was formed by an electrolytic plating process using a plating bath where 1% by volume of 28% aqueous ammonium were added to an aqueous solution containing 0.175 mol/L of $SnCl_2 \cdot 2H_2O$, 0.075 mol/L of $NiCl_2 \cdot 6H_2O$, 0.125 mol/L of glycine and 0.50 mol/L of $K_4P_2O_7$.

Each of the comb-shaped electrodes where the active material layers were formed using the resist composition of Example 2 or 3 was observed with respect to the situation of forming the active material layer by a microscope. As a result, it was confirmed that the shape of guide holes was maintained and a large amount of the active material layers were precisely formed inside the guide holes when the resist composition of Example 3 (cationic polymerization type resist composition) was used. On the other hand, a part of the guide holes was deformed due to swelling by the solvent in the electrophoresis and the active material layers were not precisely formed, when the resist composition of Example 2 (novolak type resist composition) was used. Accordingly, it is understood that the cationic polymerization type resist composition is preferable as the resist composition for forming guide holed in the method for producing the comb-shaped electrode with fine configuration.

What is claimed is:

1. A method for producing a comb-shaped electrode, in which a positive electrode and a negative electrode are respectively formed into a comb shape and oppositely disposed so that parts of teeth of the comb shapes are alternatively arranged, the method comprising:

forming a conductive layer on a surface of a substrate and patterning the conductive layer into at least a pair of comb shapes to form a current collector;

coating a resist composition on the surface of the substrate containing a part of the current collector formed in the current collector forming step to form a resist layer;

forming a guide hole for forming the positive electrode or the negative electrode above the current collector by irradiating a surface of the resist layer with light through a mask and developing to remove a part of the resist layer positioned above the current collector, depositing active material inside of the guide hole, and removing the resist layer formed on the guide hole after depositing the active material inside of the guide hole, wherein the resist composition is selected from the group consisting of the resist compositions (i) to (iv) below:

(i) a cationic polymerization type resist composition containing a compound with an epoxy group and a cationic polymerization initiator, (ii) a novolak type resist composition containing a novolak resin and a photosensitizing agent, (iii) a chemically-amplified type resist composition containing a resin which has an acid-dissociating elimination group and increases alkali solubility when the elimination group is eliminated by action of an acid generated from a photo-acid-generating agent through exposure and the photo-acid-generating agent, and (iv) a radical polymerization type resist composition containing a monomer having an ethylenically unsaturated bond and/or a resin having an ethylenically unsaturated bond, and a radical polymerization initiator in which the number of the ethylenically unsaturated bond per molecule of the monomer is 3 or less when containing the monomer having the ethylenically unsaturated bond.

2. The method for producing a comb-shaped electrode according to claim 1, wherein the resist composition is one of (i) to (iii).

3. The method for producing a comb-shaped electrode according to claim 1, wherein the resist composition is (i).

* * * * *